US012621986B2

(12) United States Patent
Jain et al.

(10) Patent No.: US 12,621,986 B2
(45) Date of Patent: May 5, 2026

(54) MEMORY DEVICE WITH PERIPHERAL CIRCUITRY WHICH EXTENDS UNDER A BACK END MEMORY ARRAY

(71) Applicant: Intel Corporation, Santa Clara, CA (US)

(72) Inventors: Pulkit Jain, Hillsboro, OR (US); Juan Alzate Vinasco, Tigard, OR (US); Liqiong Wei, Portland, OR (US); Ozdemir Akin, Beaverton, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 17/834,679

(22) Filed: Jun. 7, 2022

(65) Prior Publication Data

US 2023/0397410 A1     Dec. 7, 2023

(51) Int. Cl.
*G11C 7/06* (2006.01)
*G11C 11/408* (2006.01)
*G11C 11/4091* (2006.01)
*H10B 12/00* (2023.01)

(52) U.S. Cl.
CPC .......... *H10B 12/50* (2023.02); *G11C 11/4085* (2013.01); *G11C 11/4091* (2013.01); *H10B 12/315* (2023.02)

(58) Field of Classification Search
CPC ....................... G11C 11/4091; G11C 11/4074
See application file for complete search history.

(56) References Cited

U.S. PATENT DOCUMENTS

| | | | | |
|---|---|---|---|---|
| 11,069,385 B1 * | 7/2021 | Li | ............... | H10B 12/30 |
| 11,074,964 B1 * | 7/2021 | Kawamura | ............ | G11C 5/10 |
| 11,152,056 B1 * | 10/2021 | Seo | ............ | G11C 11/2255 |
| 11,495,283 B2 * | 11/2022 | He | ............ | G11C 11/4074 |
| 2011/0063889 A1 * | 3/2011 | Fukano | ............ | G11C 5/025 365/148 |
| 2011/0141793 A1 * | 6/2011 | Kono | ............ | G11C 5/063 365/148 |
| 2011/0188283 A1 * | 8/2011 | Chevallier | ............ | G11C 8/12 977/755 |
| 2014/0192594 A1 * | 7/2014 | Lue | ............ | G11C 16/10 365/185.11 |
| 2016/0005463 A1 * | 1/2016 | Park | ............ | G11C 13/0021 365/148 |
| 2020/0035683 A1 | 1/2020 | Sharma et al. | | |
| 2020/0051613 A1 * | 2/2020 | Derner | ............ | G11C 5/025 |

* cited by examiner

*Primary Examiner* — Mushfique Siddique
(74) *Attorney, Agent, or Firm* — Essential Patents Group, LLP

(57) ABSTRACT

Techniques and mechanisms for accessing memory arrays which are formed in a back end of line (BEOL) of an integrated circuit (IC) die. In an embodiment, a differential sense amplifier of the IC die is coupled to a first array and a second array via a first bit line and a second bit line, respectively. The first bit line and the second bit line extend from a first level of BEOL memory arrays, toward a front end of line (FEOL) of the IC die, on opposite respective sides of first array, wherein the differential sense amplifier is in a footprint region for the first memory array. In another embodiment, a word line driver circuit comprises a two stage charger-discharger circuit which mitigates hot carrier injection.

13 Claims, 10 Drawing Sheets

100

110    132

111

126    122    110

111    120

128    130

121

124

126    110

122

124    111    120

128    130

121

110

110    132

111    105

132

102

101

Legend 150

| | |
|---|---|
| contact 152 | |
| semiconductor material 154 | |
| word line 156 | |
| level select line 158 | | z x ⊗ → y

Figure 7:
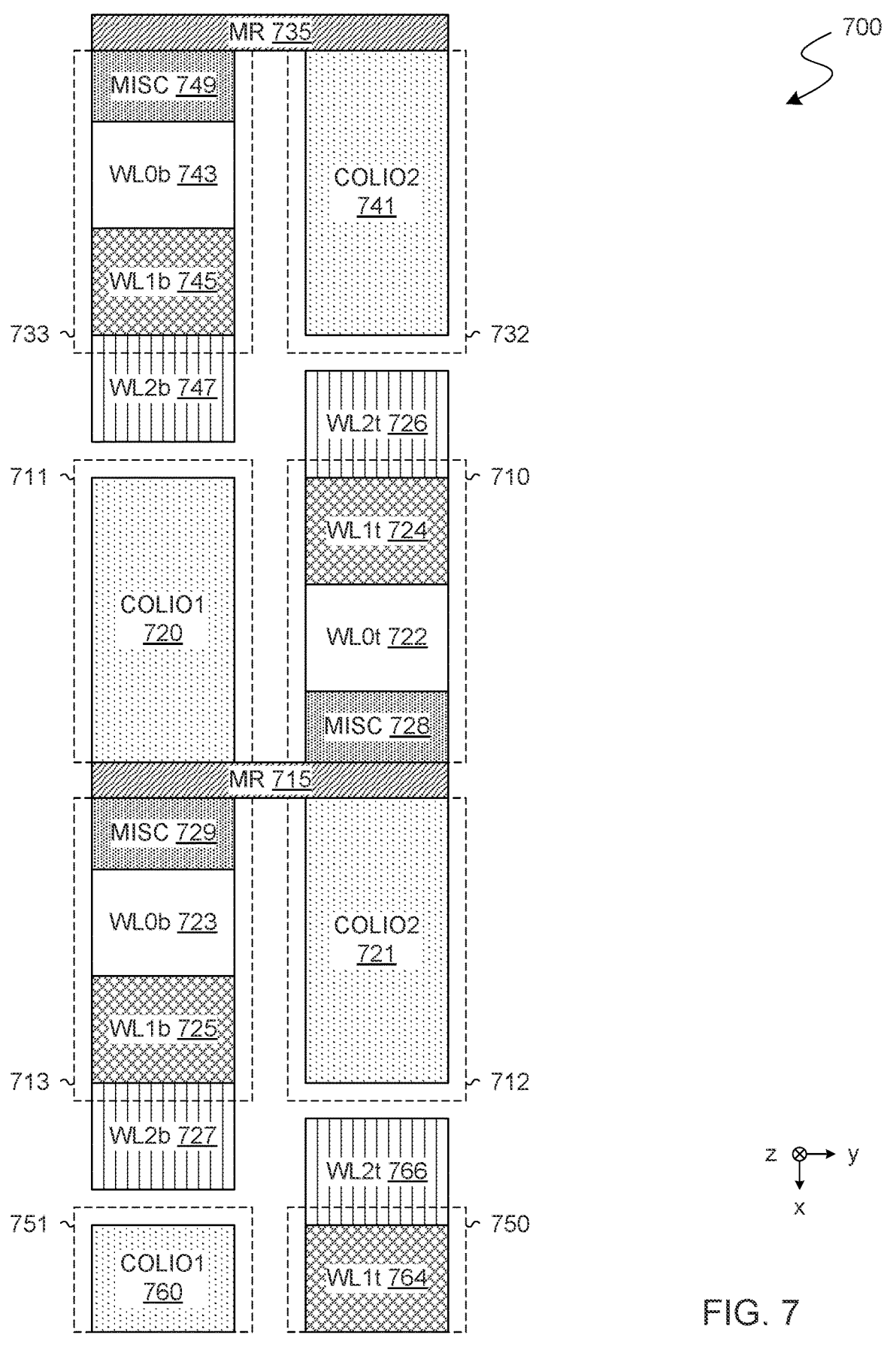

700

MR 735

MISC 749

WL0b 743

WL1b 745

733

WL2b 747

COLIO2
741

732

WL2t 726

711

710

WL1t 724

COLIO1
720

WL0t 722

MISC 728

MR 715

MISC 729

WL0b 723

WL1b 725

713

WL2b 727

COLIO2
721

712

WL2t 766

751

750

COLIO1
760

MEMORY DEVICE WITH PERIPHERAL CIRCUITRY WHICH EXTENDS UNDER A BACK END MEMORY ARRAY

BACKGROUND

1. Technical Field

This disclosure generally relates to memory devices and more particularly, but not exclusively, to peripheral circuitry which is to provide access to a back end memory array.

2. Background Art

Various types of embedded memory are monolithically integrated with a host IC (i.e., both memory and the host IC fabricated on the same chip). For embedded memory applications, reducing the overall memory array footprint helps achieve larger memories and/or reduce device cost. One form of embedded memory is embedded dynamic random access memory (eDRAM). The architecture of eDRAM is typically based on a 1T-1C cell that includes a cell "write" or "select" transistor and a storage capacitor.

The back end of line (BEOL) of an integrated circuit fabrication process is the portion of IC fabrication where individual semiconductor devices (whether embedded memory or logic transistors) are interconnected to one another with electrically conductive features such as metal interconnect traces (lines) within a given metallization level and metal-filled conductive vias between multiple metallization levels. For some memory devices, a transistor of a memory cell is fabricated in the back-end-of-line (BEOL), with the channel material being a thin film semiconductor material rather than the monocrystalline semiconductor (e.g., Si) typical of front end of line (FEOL) transistors. For some eDRAM, the capacitor is also fabricated in the BEOL and electrically coupled to the transistor through one or more metal interconnect layers formed in the BEOL.

Typically, memory cells implemented in a BEOL are interconnected to peripheral circuitry (e.g., address decoders) which is implemented with CMOS logic fabricated in the FEOL. The interconnection however becomes much more difficult if more than one level of memory cells is implemented in the BEOL. For example, where an IC chip includes two or more memory cell levels, the set of data lines (e.g., 1,024 bit lines) associated with each memory cell array level would need to be routed down to periphery circuitry. However, routing this many lines down from two, three, or more memory array levels would require significant area.

As successive generations of embedded memory technologies continue to increase in number, variety, and capability, there is expected to be an increasing premium placed on improvements to the space efficiency of these circuit architectures.

BRIEF DESCRIPTION OF THE DRAWINGS

The various embodiments of the present invention are illustrated by way of example, and not by way of limitation, in the figures of the accompanying drawings and in which:

FIG. 7 shows a cross-sectional top view diagram illustrating features of an IC die to access memory arrays in various levels of a back end of line according to an embodiment.

DETAILED DESCRIPTION

Figure 1:
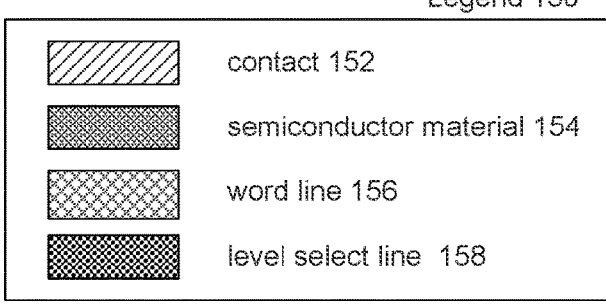
FIG. 1 shows a cross-sectional side view diagram illustrating features of an integrated circuit (IC) structure to provide access to multiple back end memory arrays according to an embodiment.

Embodiments discussed herein variously provide techniques and mechanisms for accessing memory arrays which are formed in a back end of line of an integrated circuit (IC) die. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an IC die having formed therein multiple back end memory arrays.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

FIG. 1 shows features of an IC structure 100 to provide access to multiple back end memory arrays according to an embodiment. The IC structure 100 illustrates one example of an embodiment wherein memory arrays are variously formed in a back end of line (BEOL) of an IC die, and wherein circuitry to implement an access of the memory arrays (referred to herein as "peripheral circuitry"), comprises transistors and/or other active circuit components in a front end of line (FEOL) of the IC die. The peripheral circuitry includes (for example) a differential sense amplifier which is coupled to receive signals each from a respective one of two memory arrays—e.g., wherein the differential sense amplifier extends in a footprint region under one of said two memory arrays.

In the example embodiment shown, a front end of line (FEOL) of IC structure 100 comprises an active layer 102 which includes active circuit components (e.g., including any of various combinations of transistors, diodes and/or the like) fabricated in and/or on a semiconductor substrate 101. Peripheral circuitry 105 of IC structure 100 includes a plurality of MOSFETs and/or other transistor circuits in active layer 102—e.g., wherein some or all such transistor circuits each comprise a respective channel including a monocrystalline semiconductor.

In some embodiments, a back end of line (BEOL) of IC structure 100 comprises an alternating arrangement of dielectric material layers 110, and dielectric material layers 111, wherein interconnect structures variously extend in dielectric material layers 110, 111 to provide connectivity with and/or between circuits of active layer 102 and/or memory arrays of the BEOL. In one such embodiment, peripheral circuitry 105 further includes one or more layers of interconnect metallization 132 embedded in various ones of dielectric material layers 110, 111. In the exemplary embodiment illustrated, peripheral circuitry 105 includes metal-one (M1), metal-two (M2) and metal-three (M3) interconnect metallization layers, but may include a different number of interconnect metallization layers in other embodiments.

One or more levels of memory arrays—e.g., including the illustrative memory array levels 120 shown—are variously formed in different respective vertical (z-axis) regions in the BEOL. By way of illustration and not limitation, one or more eDRAM memory arrays comprise one transistor, one capacitor (1T1C) memory cells, including the cells 122 variously denoted by dashed lines in FIG. 1. For example, a given memory cell array level 120 comprises thin film transistors (TFTs) 121, wherein a given memory array in that memory cell array level 120 includes a 1T1C memory cell 122 comprising one TFT 121 as a cell select transistor. Another of TFTs 121 is operable as an array level select transistor 128, in an embodiment. In still another embodiment, array level select transistor 128 is implemented in peripheral circuitry 105 (e.g., with structures of active layer 102. As illustrated with IC structure 100 and the legend 150, individual ones of cell select TFTs 121 include a gate terminal coupled to a word line 156, while individual ones of level select transistors 128 include a gate terminal coupled to a level select line 158.

As shown, some or all TFTs 121 of a given memory cell array level 120 employ a semiconductor material 154, which is separated from word line 156 or level select line 158 by a gate dielectric. Additionally or alternatively, word line 156 and array level select line 158 are in the same metallization level with TFTs 121 being "bottom-gate" devices with semiconductor material 154 having been deposited over word lines 156 and array level select line 158. In other embodiments, TFTs 121 instead are top-gate devices, multigate devices (e.g., having both a top-gate and a bottom-gate), or sidewall-gated devices (e.g., a finFET) as embodiments herein are not limited in this respect.

Within each of the 1T1C memory cells 122 is a respective capacitor 126 which, for example, is above a corresponding cell select transistor 124. In the illustrated example, there is no capacitor 126 over array level select transistor 128. Alternatively, a dummy capacitor may be present over array level select transistor 128 if the dummy capacitor does not hinder interconnection of array level select transistor 128.

As shown in FIG. 1, interconnect metallization from peripheral circuitry 105 extends up through multiple levels of metallization and couples to any of various bit line structures 130 each for a respective one of the one or more array levels 120. An array level select transistor 128 facilitates access to a corresponding one or more memory arrays via routing between any number of array levels 120 and peripheral circuitry 105. In other embodiments, in the absence of array level select transistor 128, a separate route to peripheral circuitry 105 would be required for every bit line of every memory cell array level.

In various embodiments, a given bit line structure 130 comprises a global bit line portion and a level-specific local bit line portion. For example, a local bit line portion of said bit line structure 130 is within the same metallization level as the global bit line portion, wherein the bit line structure 130 is coupled to one terminal contact 152 of an array level select transistor 128.

Although the BEOL of IC structure 100 is shown as comprising multiple array levels 120, in other embodiments, the BEOL comprises only one such array level 120. Additionally or alternatively, a given array level 120 comprises multiple memory arrays, in some embodiments—e.g., wherein said multiple arrays are each to be accessed via different respective word lines and different respective bit lines.

As detailed herein, some embodiments facilitate improved space efficiency of a back end memory architecture by providing bit line routing and/or word line routing which enables one or more peripheral circuit components to be positioned, at least in part, in a "footprint area" which is directly under one or more memory arrays that are to be accessed with said one or more peripheral circuit components.

For example, such one or more peripheral circuit components comprise a differential sense amplifier. In one such embodiment, the differential sense amplifier is coupled to a bit line which facilitates access to one memory array, and is further coupled to another bit line which facilitates access to a different memory array. Such a differential sense amplifier provides functionality to compare the respective voltages on the two bit lines—e.g., during a read operation—to determine a data value stored in a corresponding memory cell.

Figure 2:
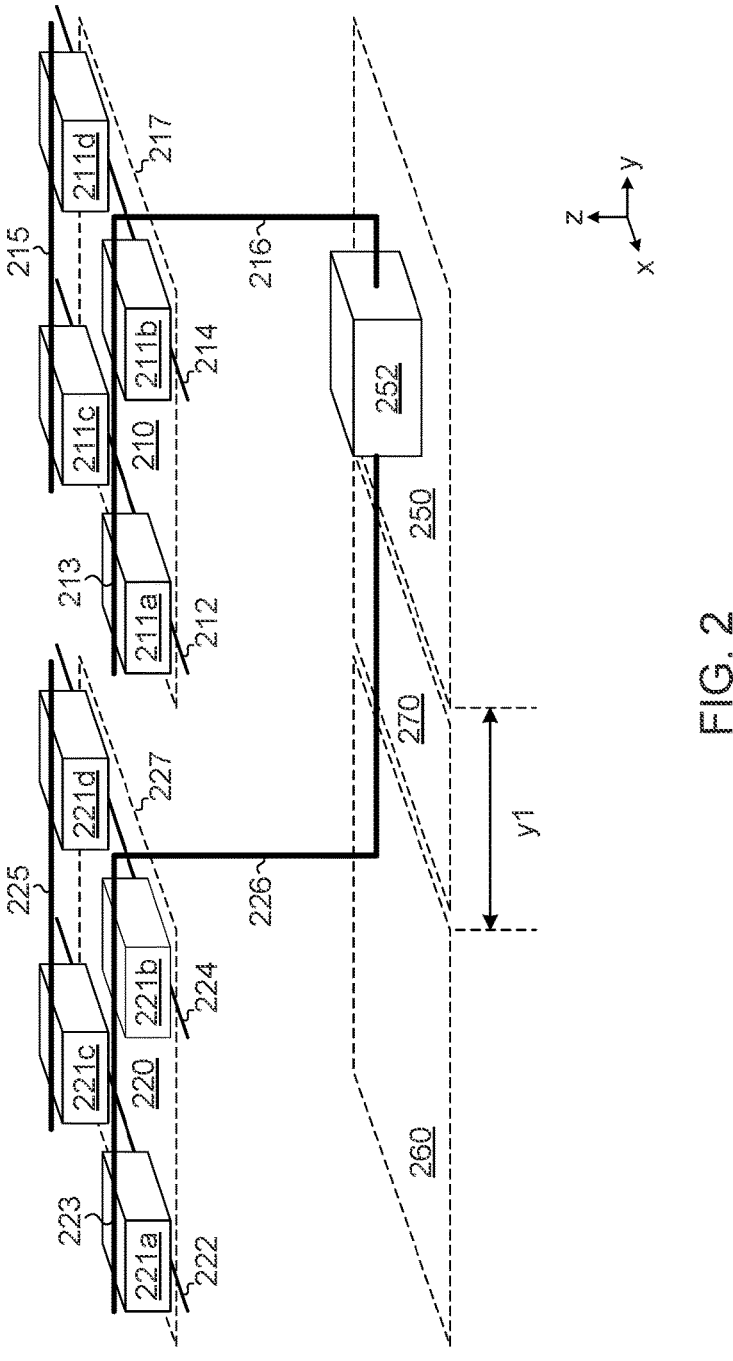
FIG. 2 shows a perspective view diagram illustrating features of an IC device to operate multiple memory arrays of a back end according to an embodiment.

FIG. 2 shows features of an IC device 200 to operate multiple memory arrays of a back end according to an embodiment. IC device 200 illustrates one example of an embodiment which comprises "back end" memory arrays—i.e., memory arrays which are formed in a BEOL of an IC die—and peripheral circuitry to provide access to said back end memory arrays. The peripheral circuitry includes a differential sense amplifier circuit which is coupled to communicate with at least two such memory arrays. A FEOL of such an IC die comprises an active layer including transistors and/or other active circuit components of the differential sense amplifier—e.g., wherein some or all of the differential sense amplifier circuit is located in a footprint region under one or more of the at least two memory arrays. In various embodiments, IC device 200 provides functionality such as that of IC structure 100.

As shown in FIG. 2, IC device 200 comprises back end memory arrays 210, 220 which each comprise respective memory cells that are arranged in rows and columns. For a given one of memory arrays 210, 220, respective bit lines and respective word lines variously facilitate access to the memory cells thereof. A given bit line extends along a corresponding column, and across rows, of the given memory array, wherein a given word line extends along a corresponding row, and across columns, of that given memory array. In various embodiments illustrated herein, a given column of a memory array (and a corresponding bit line to access said column) extends in a direction along the y-axis shown, whereas a given row of the memory array (and a corresponding word line to access said row) extends in another direction along the x-axis shown.

In the illustrative embodiment shown, array 210 comprises memory cells 211a through 211d (referred to collectively as memory cells 211). For example, a first column of array 210 comprises cells 211a, 211b, and a second column of array 210 comprises cells 211c, 211d, wherein the first column and the second column are accessed with bit lines 213, 215 (respectively). Furthermore, a first row of array 210 comprises cells 211a, 211c, and a second row of array 210 comprises cells 211b, 211d, wherein the first row and the second row are accessed with word lines 212, 214 (respectively). Although a simplified 2×2 memory array 210 is shown for illustrative purposes, array 210 is to typically further comprise one or more other rows (not shown) which, for example, are between the first row and the second row. Additionally or alternatively, array 210 further comprises one or more other columns (not shown) which, for example, are between the first column and the second column.

Memory array 210 extends in an array area 217 (for brevity, sometimes referred to herein simply as an "area") of a horizontal (x-y) plane—e.g., wherein area 217 is defined by a maximum horizontal range of memory cells 211. In an embodiment, first sides of area 217 (the first sides opposite each other) are formed by different respective ones of an upper most row of array 210 or a lower most row of array 210. Furthermore, second sides of area 217 (the second sides opposite each other) are formed by different respective ones of a leftmost column of array 210 or a rightmost column of array 210. Accordingly, memory array 210 corresponds to a respective footprint region (or simply "footprint") which is vertically under the array area 217, and which is defined by a periphery of area 217. In an embodiment, the footprint region for array 210 comprises a horizontal footprint area 250 which (for example) is at or under an active layer of IC device 200.

Similarly, array 220 comprises memory cells 221a through 221d (referred to collectively as memory cells 221). The BEOL comprises bit lines 223, 225 which are to enable access to respective columns of memory cells 221—e.g., wherein bit lines 223, 225 provide functionality similar to that of bit lines 213, 215. Furthermore, word lines 222, 224 are to enable access to respective rows of memory cells 221—e.g., wherein word lines 222, 224 provide functionality similar to that of word lines 212, 214. An array area 227 for memory array 220 is defined (for example) by a horizontal range of memory cells 221, wherein a periphery of area 227 defines a respective footprint region under memory array 220. Similar to array 210, the footprint region for array 220 comprises a horizontal footprint area 260 which is at or under the active layer. An area 270 between footprint areas 250, 260 corresponds to a separation between areas 217, 227—e.g., wherein the separation is equal to a distance y1 along the y-axis shown.

Memory cells 211 and memory cells 221 comprise 1T1C memory cells, for example. In an embodiment, peripheral circuitry of IC device 200 comprises a differential sense amplifier 252 which is coupled to bit lines 213, 223, which facilitate access to memory array 210 and memory array 220 (respectively). For example, differential sense amplifier 252 comprises circuitry to receive respective signals via bit lines 213, 223, and to compare the voltages thereof to determine a data value stored in a memory cell of one of the arrays 210, 220. In various embodiments, differential sense amplifier 252 includes circuitry adapted from any of various conventional differential sense amplifier architectures, which are not detailed herein to avoid obscuring features of said embodiments.

Some embodiments improve space efficiency of a back end memory architecture by positioning differential sense amplifier 252 at least partially (for example, entirely) in or on one of the footprint areas 250, 260 which are under the arrays 210, 220 that are accessed via differential sense amplifier 252. For example, bit lines 213, 223 comprise respective vertical (z-axis) interconnect structures 216, 226 which each extend from the array layer which includes arrays 210, 220 toward an underlying region in which differential sense amplifier 252 extends. In some illustrative embodiments, interconnect structures 216, 226 variously extend from the array layer—e.g., through the array layer—on opposite respective sides of area 217 (for example). In one such embodiment, interconnect structure 226 extends vertically between areas 217, 227—i.e., over an area 270 which is between footprint areas 250, 260.

In providing such routing of interconnect structures 216, 226 past opposite respective sides of area 217, some embodiments facilitate an arrangement wherein differential sense amplifier 252 extends at least partially under the footprint area 250 under area 217 (or in an alternative embodiment, at least partially under the footprint area 260 under area 227). In turn, such an arrangement of differential sense amplifier 252 enables a horizontal distance y1 between areas 217, 227 which is relatively small, as compared to existing architectures. By way of illustration and not limitation, distance y1 is less than 6 microns (μm), in various embodiments—e.g., wherein distance y1 is less than 3 μm, and—in some embodiments, less than 2 μm.

Figure 3:
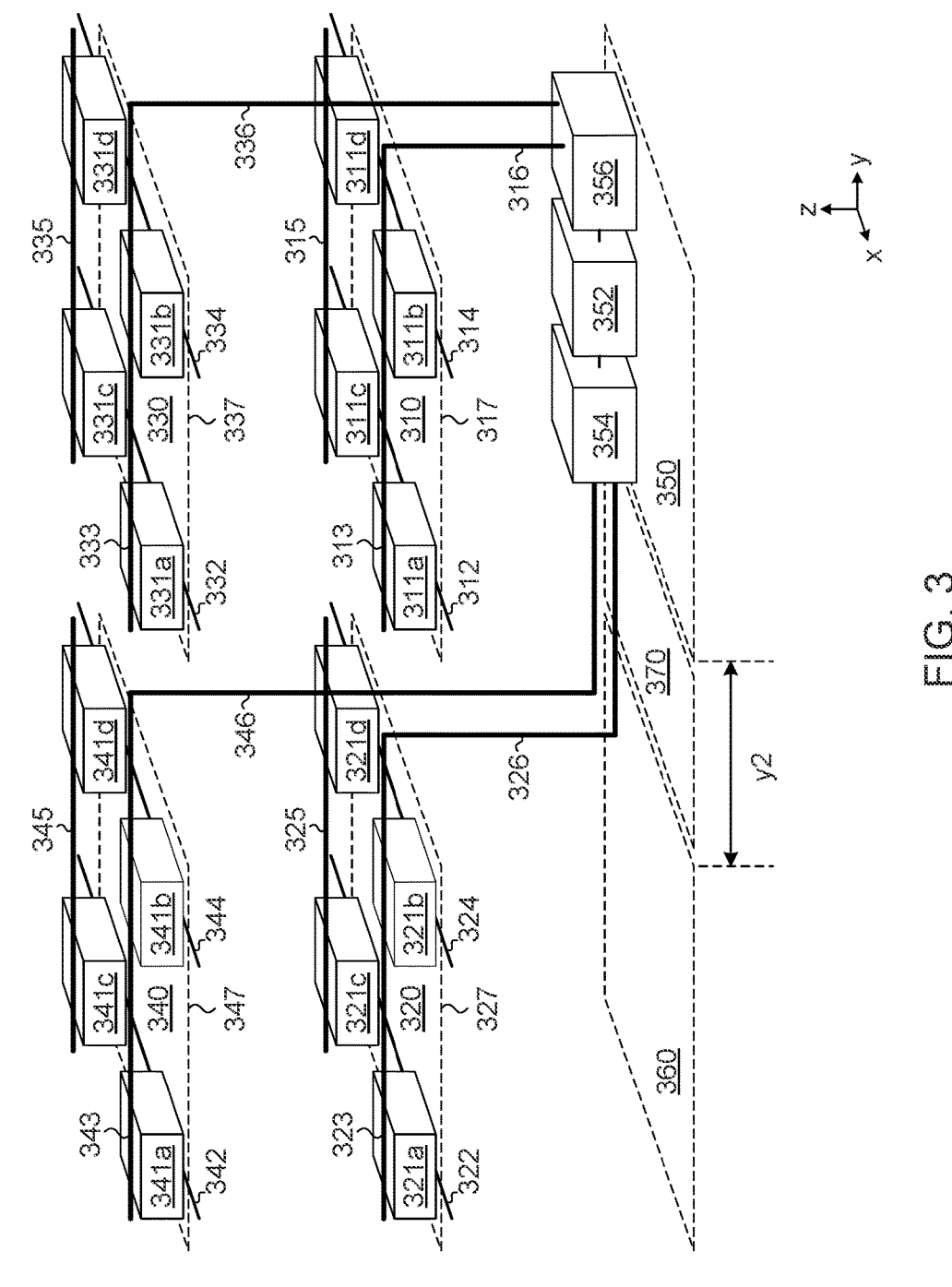
FIG. 3 shows a perspective view diagram illustrating features of an IC device to variously access back end memory arrays according to an embodiment.

FIG. 3 shows features of an IC device 300 to operate back end memory arrays at various respective array levels of according to an embodiment. IC device 300 illustrates one example of an embodiment wherein peripheral circuitry is coupled to facilitate access to memory arrays in various levels of a BEOL, wherein a differential sense amplifier (and/or other components of the peripheral circuitry) extends in a footprint region under two or more such memory arrays. In various embodiments, IC device 300 provides functionality of one of IC structures 100, 200.

As shown in FIG. 3, a BEOL of IC device 300 comprises memory arrays arranged in multiple array levels comprising a first level and a second level over the first level. A FEOL of IC device 300 comprises peripheral circuitry to variously provide access to said memory arrays. In the example embodiment shown, such peripheral circuitry comprises a differential sense amplifier 352—which (for example) provides functionality such as that of differential sense amplifier 252—and both level selection circuitry 354, level selection circuitry 356 to variously support an accessing of the first level and the second level.

In the example embodiment shown, the first array level comprises arrays 310, 320 which (for example) correspond functionally to arrays 210, 220. Array 310 comprises memory cells 311a through 311d (referred to collectively as memory cells 311) which are variously accessed via bit lines 313, 315 and word lines 312, 314. Array 320 comprises memory cells 321*a* through 321*d* (referred to collectively as memory cells 321) which are variously accessed via bit lines 323, 325 and word lines 322, 324.

Furthermore, the second array level comprises arrays 330, 340 which (for example) are positioned vertically over arrays 310, 320 (respectively). Array 330 comprises memory cells 331*a* through 331*d* (referred to collectively as memory cells 331) which are variously accessed via bit lines 333, 335 and word lines 332, 334. Array 340 comprises memory cells 341*a* through 341*d* (referred to collectively as memory cells 341) which are variously accessed via bit lines 343, 345 and word lines 342, 344. In various embodiments, some or all of arrays 310, 320, 330, 340 each comprise one or more other rows and/or one or more other columns (not shown).

An array area 317 for memory array 310 is defined (for example) by a horizontal range of memory cells 311, wherein a periphery of area 317 defines a respective footprint region under memory array 310. Similar to array 210, the footprint region for array 310 comprises a horizontal footprint area 350 which is at or under the active layer. Similarly, a periphery of an array area 327 for memory array 320 defines another footprint region which comprises a horizontal footprint area 360 at or under the active layer.

In the embodiment shown, another array area 337 for memory array 330 is defined (for example) by a horizontal range of memory cells 331, and a further array area 347 for memory array 340 is defined by a horizontal range of memory cells 341. In various embodiments, array 310 extends at least partially in a footprint region for array 330, and/or array 320 extends at least partially in a footprint region for array 340. An area 370 between footprint areas 350, 360 corresponds to a separation between areas 317, 327 (and/or between areas 337, 347)—e.g., wherein the separation is equal to a distance y2 along the y-axis shown.

Some of all of memory cell 311, 321, 331, 341 comprise 1T1C memory cells, for example. In an embodiment, peripheral circuitry of IC device 300 comprises level selection circuitry 354, and level selection circuitry 356, and further comprises a differential sense amplifier 352 which is variously coupled to bit lines 316, 326, 36, 346 via level selection circuitry 354 and level selection circuitry 356.

Level selection circuitry 354 comprises one or more switches, multiplexer circuits, demultiplexer circuits and/or any of various types of circuitry suitable to selectively enable communication between differential sense amplifier 352 and either of arrays 320, 340 (via bit lines 323, 343, respectively). Similarly, level selection circuitry 356 also comprises any of various types of circuitry which are suitable to selectively enable communication between differential sense amplifier 352 and either of arrays 310, 330 (via bit lines 313, 333, respectively). In some embodiments, control signaling (not shown) to variously operate differential sense amplifier 352, level selection circuitry 354 and level selection circuitry 356 is generated, for example, using digital control circuitry which—for example—is adapted from conventional memory device designs and techniques. Such conventional designs and techniques are not detailed herein to avoid obscuring certain features of such embodiments. The peripheral circuitry of IC device 300 further comprises word line driver circuits (not shown) to variously communicate with the various word lines of arrays 310, 320, 330, 340.

Various embodiments provide efficient space utilization wherein some or all of differential sense amplifier 352, level selection circuitry 354, and level selection circuitry 356 extend partially or entirely in or on one of the footprint areas 350, 360. By way of illustration and not limitation, bit lines

313, 333 comprise respective vertical (z-axis) interconnect structures 316, 336 which each extend from arrays 310, 330 (respectively) toward a coupling with level selection circuitry 356 at the underlying active layer. Similarly, bit lines 323, 343 comprise respective vertical interconnect structures 326, 346 which each extend from arrays 320, 340 (respectively) toward a coupling with level selection circuitry 354 at the underlying active layer. In one such embodiment, interconnect structures 316, 326 extend from (e.g., through) the first array level, on opposite respective sides of area 317, toward the active layer. Furthermore, interconnect structures 336, 346 extend from (e.g., through) the second array level, on opposite respective sides of area 337—and also, through the first array level on opposite respective sides of area 317—toward the active layer.

In providing such routing of interconnect structures 316, 326, 336, 346 relative to areas 317, 327, 337, 347, some embodiments facilitate an arrangement wherein differential sense amplifier 352, level selection circuitry 354, and level selection circuitry 356 extend at least partially under the footprint area 350 under area 317 (or in an alternative embodiment, at least partially under the footprint area 360 under area 327). In turn, such an arrangement of differential sense amplifier 352 enables a horizontal distance y2 between areas 317, 327 which is relatively small, as compared to existing architectures.

Figure 4:
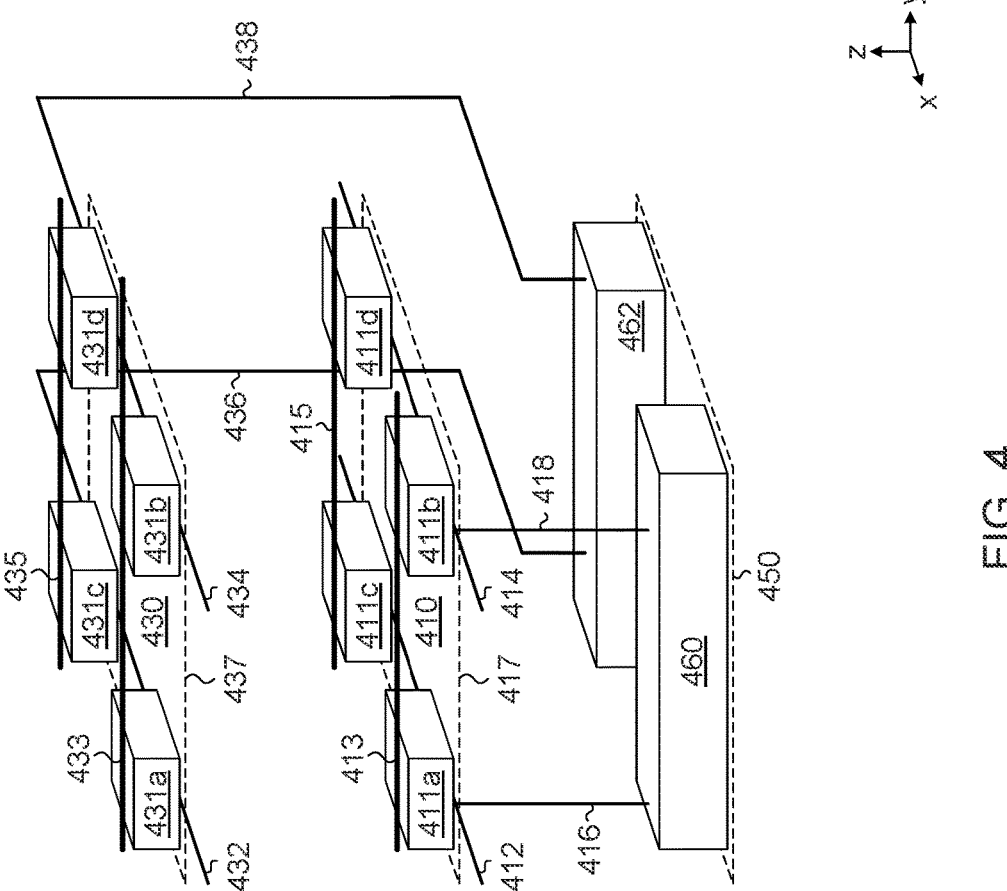
FIG. 4 shows a perspective view diagram illustrating features of an IC device to access memory arrays in various levels of a back end of line according to an embodiment.
Figure 4:
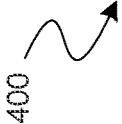

FIG. 4 shows features of an IC device 400 to access memory arrays in various back end layers according to an embodiment. IC device 400 illustrates one example of an embodiment wherein word line driver circuitry is in a footprint area of one or more backend memory arrays. In various embodiments, IC device 400 provides functionality of one of IC structures 100, 200, 300.

As shown in FIG. 4, a BEOL of IC device 400 comprises memory arrays arranged in multiple array levels comprising a first level and a second level over the first level. A FEOL of IC device 400 comprises peripheral circuitry to variously provide access to said memory arrays. In the example embodiment shown, such peripheral circuitry comprises word line driver circuits 460, 462 to variously access memory arrays of different respective array levels of a BEOL. In some embodiments, the peripheral circuitry further comprises one or more differential sense amplifiers, and level selection circuitry and/or other components (not shown) which are formed in or on an active layer.

In the example embodiment shown, the first array level and the second array level comprise—respectively—arrays 410, 430 which (for example) correspond functionally to arrays 310, 330. Array 410 comprises memory cells 411*a* through 411*d* (referred to collectively as memory cells 411) which are variously accessed via bit lines 413, 415 and word lines 412, 414. Similarly, array 430 comprises memory cells 431*a* through 431*d* (referred to collectively as memory cells 431) which are variously accessed via bit lines 433, 435 and word lines 432, 434. In various embodiments, some or all of arrays 410, 430 each comprise one or more other rows and/or one or more other columns (not shown).

An array area 417 for memory array 410 is defined (for example) by a horizontal range of memory cells 411, wherein a periphery of area 417 defines a respective footprint region under memory array 410. The footprint region for array 410 comprises a horizontal footprint area 450 which is at or under the active layer. In an embodiment, a periphery of an array area 437 for memory array 430 defines a footprint region which overlaps (and for example, includes) the footprint region for array 410.

Various embodiments provide efficient space utilization wherein some or all of word line driver circuit 460 and word line driver circuit 462 extend, partially or entirely, in or on one of the footprint area 450 which is under both of arrays 410, 430. By way of illustration and not limitation, word lines 412, 414 comprise respective vertical (z-axis) inter-connect structures 416, 418 which variously extend from array 410 toward a coupling with word line driver circuit 460 at the underlying active layer.

Similarly, word lines 432, 434 comprise respective ver-tical interconnect structures 436, 438 which variously extend from array 430 toward a coupling with word line driver circuit 462 at the underlying active layer. In some embodiments, interconnect structures 416, 418 extend from the first array level—e.g., from within a periphery of area 417—toward the active layer. Additionally or alternatively, interconnect structures 436, 438 extend from (e.g., through) the second array level—and also, through the first array level—toward the active layer. In one such embodiment, interconnect structures 436, 438 extend through the second array level in a region which is outside of the periphery of area 437. In providing such routing of interconnect struc-tures 416, 418, 436, 438 relative to areas 417, 437—and also, relative to word line driver circuit 460 and word line driver circuit 462—some embodiment variously enable a space efficient positioning of word line driver circuit 460 and word line driver circuit 462 in footprint area 450.

Figure 5:
FIG. 5 shows a cross-sectional top view diagram illustrating features of an IC die to operate multiple memory arrays of a back end according to an embodiment.
Figure 5:
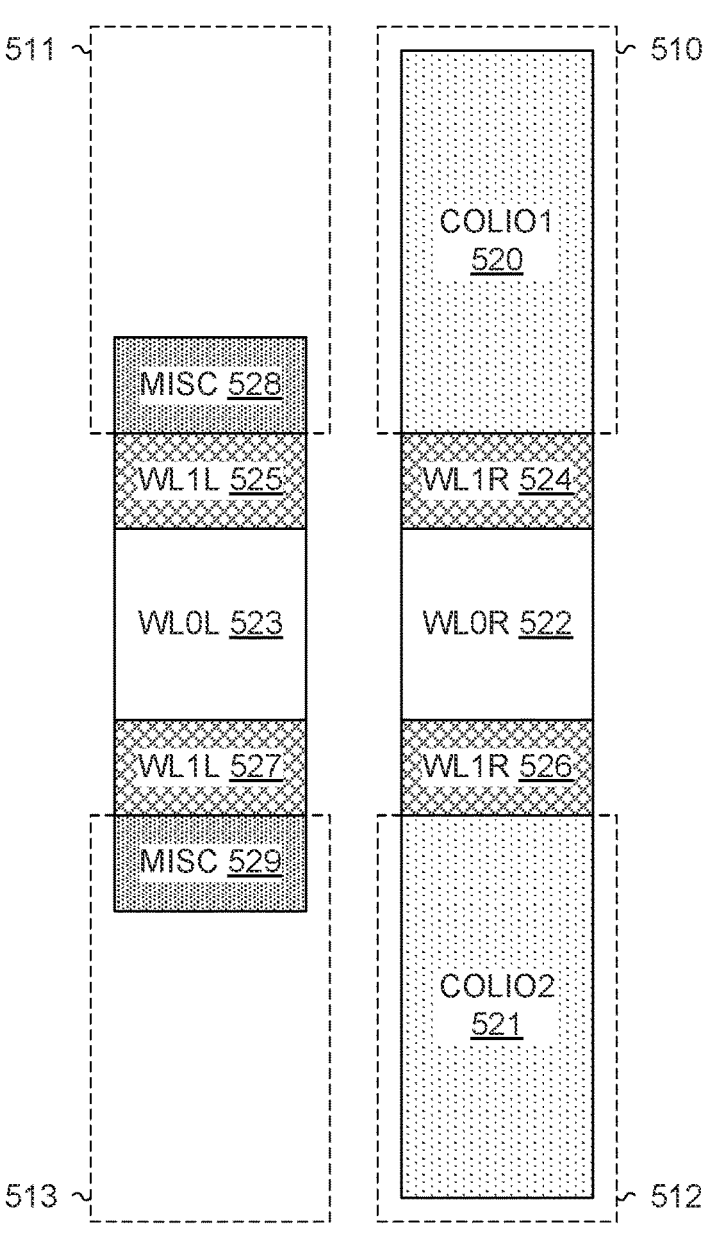
Figure 5:
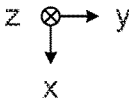

FIG. 5 shows features of an IC die 500 to operate multiple memory arrays of a back end according to an embodiment. IC die 500 illustrates one example of an embodiment wherein each of multiple differential sense amplifier circuits is in a footprint of a respective plurality of back end memory arrays which (in turn) are to be accesses by that differential sense amplifier circuit. IC die 500 is shown in a cross-sectional top view of an active layer such as active layer 102. In various embodiments, IC die 500 includes features of IC structure 100, and/or one of IC devices 200, 300, for example.

IC die 500 comprises various peripheral circuit structures, which are shown in FIG. 5 relative to various footprint areas 510-513 that each correspond to (and are in a footprint region of) a different respective one or more back end memory arrays. For example, peripheral circuitry of IC die 500 comprises column access circuitry COLIO1 520 which provides differential sense amplifier circuitry to access one or more memory arrays each corresponding to a respective one of area 510 or area 511. In some embodiments, column access circuitry COLIO1 520 further comprises level selec-tion circuitry with which the differential sense amplifier is selectively access any of multiple array levels—e.g., wherein column access circuitry COLIO1 520 provides functionality of differential sense amplifier 352, level selec-tion circuitry 354 and level selection circuitry 356. In various embodiments, column access circuitry such as COLIO1 520 further comprises one or more bit line write drivers and/or any of various other suitable circuitry to access a memory array via bit lines.

By way of illustration and not limitation, a differential sense amplifier of column access circuitry COLIO1 520 is coupled—e.g., via level selection circuitry—to two bit lines (not shown) which extend in the BEOL of IC die 500, wherein the two bit lines are to access different respective memory arrays in the same array level. For example, the two bit lines extend from that array level on opposite respective sides of one such memory array—e.g., a first array which defines a footprint region comprising area 510. In an embodiment, the two bit lines comprise a first bit line coupled to the first array, and a second bit line which is coupled to a second array which defines a footprint region comprising area 511. Furthermore, the second bit line extends from the array level, toward the underlying active layer of IC die 500, in a region which is between the first array and the second array.

Peripheral circuitry of IC die 500 further comprises column access circuitry COLIO2 521 which similarly includes sense amplifier circuitry—and, in some embodi-ments, level selection circuitry—to access memory arrays each corresponding to a respective one of area 512 or area 513. A differential sense amplifier of column access circuitry COLIO2 521 is coupled—in some embodiments, via level selection circuitry—to two bit lines (not shown) which are to access different respective memory arrays in the same array level. The two bit lines extend from that array level on opposite respective sides of one such memory array—e.g., a third array which defines a footprint region comprising area 512. For example, the two bit lines comprise a third bit line coupled to the third array, and a fourth bit line which is coupled to a fourth array which defines a footprint region comprising area 513. In an embodiment, the fourth bit line extends from the array level, to the underlying active layer of IC die 500, in a region which is between the third array and the fourth array.

In various embodiments, peripheral circuitry of IC die 500 further comprises word line driver circuitry WL1R 524 which is coupled to word lines which are to access a memory array, in a first array level, which corresponds to area 510. Furthermore, word line driver circuitry WL1R 526 of IC die 500 is coupled to other word lines which are to access another memory array, also in the first array level, which corresponds to area 512. In one such embodiment, word line driver circuitry WL1L 525 of IC die 500 is coupled to word lines which are to access another memory array, in the first array level, which corresponds to area 511. Further still, word line driver circuitry WL1L 527 is coupled to word lines which are to access another memory array, in the first array level, which corresponds to area 513.

By contrast, word line driver circuitry WL0R 522 of IC die 500 is variously coupled via word lines to access any of a first plurality of memory arrays in a second array level that, for example, is over the first array level. For example, one of the first plurality of memory arrays corresponds to area 510, wherein another of the first plurality of memory arrays corresponds to area 512. Furthermore, word line driver circuitry WL0L 523 of IC die 500 is variously coupled via word lines to access any of a second plurality of memory arrays in the second array level. In an embodiment, one of the second plurality of memory arrays corresponds to area 511, and another of the second plurality of memory arrays corresponds to area 513.

In various embodiments, some or all of the word line driver circuitry WL0R 522, WL0L 523, WL1R 524, WL1L 525, WL1R 526, WL1L 527 extend at least in part outside of the footprint areas 510-513 for the memory arrays to be variously coupled via said word line circuitry. By way of illustration and not limitation, word line driver circuitry WL0R 522, WL1R 524, and WL1R 526 are arranged along a first line, in a region between areas 510, 512 (and between column access circuitry COLIO1 520 and column access circuitry COLIO2 521). By contrast, word line driver cir-cuitry WL0L 523, WL1L 525, and WL1L 527 are arranged along a second line—parallel to the first line—in a region between areas 511, 513.

Although some embodiments are not limited in this regard, additional peripheral circuitry MISC 528 facilitates access to memory arrays each corresponding to a respective one of areas 510, 511. Similarly, additional peripheral circuitry MISC 529 facilitates access to memory arrays each corresponding to a respective one of areas 512, 513. In one example embodiment, MISC 528 and/or MISC 528 comprise timer circuitry, column control circuitry, and/or any of various other types of digital controller circuitry which facilitate operations to access the various back end memory arrays of IC die 500—e.g., where such additional peripheral circuitry is adapted from conventional memory device architectures.

Figure 6:
FIG. 6 shows a cross-sectional top view diagram illustrating features of an IC die to variously access back end memory arrays according to an embodiment.
Figure 6:
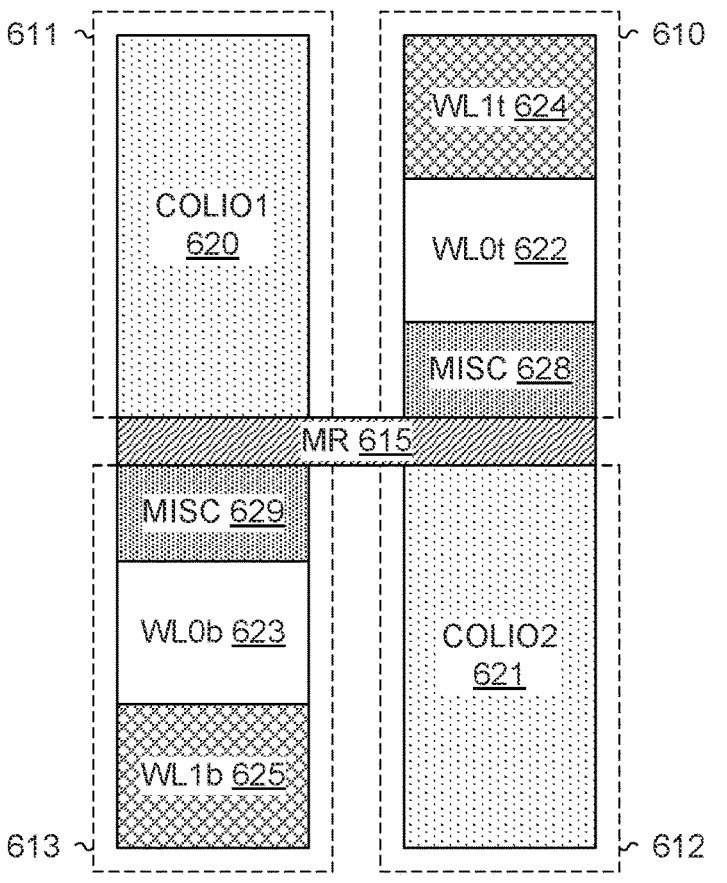
Figure 6:
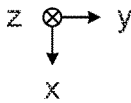

FIG. 6 shows features of an IC die 600 to variously access back end memory arrays according to an embodiment. IC die 600 illustrates one example of an embodiment wherein differential sense amplifier circuits and word line driver circuits variously extend each in a respective footprint area for a corresponding plurality of back end memory arrays. IC die 600 is shown in a cross-sectional top view of an active layer such as active layer 102. In various embodiments, IC die 600 includes features of IC structure 100, and/or one of IC devices 200, 300, 400, for example.

IC die 600 comprises various peripheral circuit structures, which are shown in FIG. 6 relative to various footprint areas 610-613 that each correspond to (and are in a footprint region of) a different respective one or more back end memory arrays. For example, peripheral circuitry of IC die 600 comprises column access circuitry COLIO1 620—e.g., corresponding functionally to column access circuitry COLIO1 520—which is to access memory arrays each corresponding to a respective one of area 610 or area 611. In an embodiment, coupling of column access circuitry COLIO1 620 to said memory arrays, via various bit lines, is similar the coupling of differential sense amplifier 352, level selection circuitry 354, and level selection circuitry 356 to arrays 310, 320, 330, 340.

Peripheral circuitry of IC die 600 further comprises column access circuitry COLIO2 621—e.g., corresponding functionally to column access circuitry COLIO2 521— which is to access memory arrays each corresponding to a respective one of area 612 or area 613. In an embodiment, coupling of column access circuitry COLIO2 621 to said memory arrays, via various bit lines, is similar the coupling of differential sense amplifier 352, level selection circuitry 354, and level selection circuitry 356 to arrays 310, 320, 330, 340.

Peripheral circuitry of IC die 600 further comprises word line driver circuitry WL0t 622 which is variously coupled via word lines to access any of a first plurality of memory arrays in a first array level—e.g., wherein one of the first plurality of memory arrays corresponds to area 610. In some embodiments, another of the first plurality of memory arrays corresponds to area 612 (or alternatively, to area 611). Furthermore, word line driver circuitry WL1t 624 of IC die 600 is variously coupled via word lines to access any of a second plurality of memory arrays in a second array level that, for example, is over the first array level. For example, one of the second plurality of memory arrays corresponds to area 610—e.g., wherein another of the second plurality of memory arrays corresponds to area 612 (or alternatively, to area 611). In one example embodiment, word line driver circuitry WL0t 622 and word line driver circuitry WL1t 624 corresponds functionally to word line driver circuit 460, and word line driver circuit 462—e.g., word line driver circuitry WL1t 624 provides functionality of word line driver circuitry WL0R 522, and wherein word line driver circuitry WL0t 622 provides functionality of both word line driver circuitry WL1R 524 and word line driver circuitry WL1R 526.

Peripheral circuitry of IC die 600 further comprises word line driver circuitry WL0b 623 which is variously coupled via word lines to access any of a third plurality of memory arrays in the first array level—e.g., wherein one of the third plurality of memory arrays corresponds to area 613. In some embodiments, another of the third plurality of memory arrays corresponds to area 611 (or alternatively, to area 612). Furthermore, word line driver circuitry WL1b 625 of IC die 600 is variously coupled via word lines to access any of a fourth plurality of memory arrays in a second array level that, for example, is over the first array level. For example, one of the fourth plurality of memory arrays corresponds to area 613—e.g., wherein another of the fourth plurality of memory arrays corresponds to area 611 (or alternatively, to area 612). In one example embodiment, word line driver circuitry WL0b 623 and word line driver circuitry WL1b 625 corresponds functionally to word line driver circuit 460, and word line driver circuit 462—e.g., word line driver circuitry WL1b 625 provides functionality of word line driver circuitry WL0L 523, and wherein word line driver circuitry WL0b 623 provides functionality of both word line driver circuitry WL1L 525 and word line driver circuitry WL1L 527.

Although some embodiments are not limited in this regard, additional peripheral circuitry MISC 628 and MISC 629 variously facilitates access to the back end memory arrays which are variously over areas 510-513. For example, circuitry MISC 528 and MISC 529 provide timer and/or other digital controller functionality such as that of circuitry MISC 628 and MISC 629, in some embodiments.

In various embodiments, column access circuitry COLIO1 620 and column access circuitry COLIO2 621—as well of some or all of the word line driver circuitry WL0t 622, WL0b 623, WL1t 624, WL1b 625, and some or all of the additional peripheral circuitry MISC 628 and MISC 629—are each at least partially (in some embodiments, entirely) within a respective one of footprint areas 610-613 By way of illustration and not limitation, column access circuitry COLIO1 620, word line driver circuitry WL0t 622, WL1t 624, and circuitry MISC 628 are variously arranged, along a first line, each in a respective one of areas 610, 612. By contrast, column access circuitry COLIO2 621, word line driver circuitry WL0b 623, WL1b 625, and circuitry MISC 629 are variously arranged along a second line—parallel to the first line—each in a respective one of areas 611, 613. In one such embodiment, area 610 is separated from area 612 (and area 611 from area 613) by a region MR 615 which extends into the BEOL—e.g., wherein region MR 615 accommodates routing of metallization structures which facilitate signal communication, across the first line and the second line, to a similar arrangement (not shown) of other memory resources similar to those shown in FIG. 6.

FIG. 7 shows features of an IC die 700 to access memory arrays in various back end layers according to an embodiment. IC die 700 illustrates one example of an embodiment wherein peripheral circuitry is arranged in a tile area which forms one or more recess structures each to accommodate a portion of a respective other tail area. The peripheral circuitry includes a differential sense amplifier and word line driver circuitry, some or all of which are each in a respective footprint region for a corresponding one or more memory arrays. In various embodiments, IC die 700 includes features of IC structure 100, and/or one of IC devices 200, 300, 400, 600, for example.

IC die 700 comprises various peripheral circuit structures, which are shown in FIG. 7 relative to various footprint areas 710-713, 732, 733, 750, 751 that each correspond to (and are in a footprint region of) a different respective one or more back end memory arrays. For example, peripheral circuitry of IC die 700 comprises column access circuitry COLIO1 720, column access circuitry COLIO2 721, various word line driver circuitry WL0t, WL0t 722, WL0b 723, WL1t 724, WL1b 725, circuitry MISC 728, and circuitry MISC 729 which—for example—correspond functionally to column access circuitry COLIO1 620, column access circuitry COLIO2 621, word line driver circuitry WL0t 622, word line driver circuitry WL0b 623, word line driver circuitry WL1t 624, word line driver circuitry WL1b 625, circuitry MISC 628, and circuitry MISC 629.

In an embodiment, word line driver circuitry WL0t 722 and word line driver circuitry WL0b 723 are each to access respective memory arrays in a first array level—e.g., wherein word line driver circuitry WL1t 724 and word line driver circuitry WL1b 725 are each to access respective memory arrays in a second array level. In one such embodiment, the peripheral circuitry further comprises word line driver circuitry WL2t 726 which is variously coupled via word lines to access any of a first plurality of memory arrays in a third array level—e.g., wherein one of the first plurality of memory arrays corresponds to area 710. In some embodiments, another of the first plurality of memory arrays corresponds to area 712 (or alternatively, to area 711). Furthermore, word line driver circuitry WL2b 727 of IC die 700 is variously coupled via word lines to access any of a second plurality of memory arrays in the third array level. For example, one of the second plurality of memory arrays corresponds to area 713—e.g., wherein another of the second plurality of memory arrays corresponds to area 711 (or alternatively, to area 712). In one such embodiment, word line driver circuitry WL2t 726 extends at least partially outside of area 710 and/or word line driver circuitry WL2b 727 extends at least partially outside of area 713.

In various embodiments, IC die 700 further comprises other back end memory arrays (in addition to those which variously correspond each to a respective one of areas 710-713), and additional peripheral circuitry to facilitate access to said other back end memory arrays.

By way of illustration and not limitation, the first, second and third levels further comprise arrays which are each over a respective one of the illustrative footprint areas 732, 733 shown. To access such arrays, IC die 700 further comprises column access circuitry COLIO2 741, various word line driver circuitry WL0b 743, WL1b 745, WL2b 747 and circuitry MISC 749, which—for example—correspond functionally to column access circuitry COLIO2 721, word line driver circuitry WL0b 723, WL1b 725, WL2b 727 and circuitry MISC 729.

Additionally or alternatively, the first, second and third levels further comprise other arrays which are each over a respective one of the illustrative footprint areas 750, 751 shown. To access such other arrays, IC die 700 further comprises column access circuitry COLIO1 760, and various word line driver circuitry WL1t 764, WL2t 766, which—for example—correspond functionally to column access circuitry COLIO1 720, and word line driver circuitry WL1t 724, WL2t 726. In some embodiments, footprint areas of IC die 700 are variously separated from one other each by a respective one of regions MR 715, MR 735 that each extend into the BEOL—e.g., wherein regions MR 715, MR 735 have features of region MR 615, for example.

In an embodiment a first tile area, at the active layer, has therein peripheral circuitry to access the memory arrays which variously correspond each to a respective one of areas 710-713. Furthermore, a second tile area at the active layer has therein peripheral circuitry to access the memory arrays which variously correspond each to a respective one of areas 732, 733. Further still, a third tile area at the active layer has therein peripheral circuitry to access the memory arrays which variously correspond each to a respective one of areas 750, 751. In one such embodiment, the first, second and third tile areas each form a respective recess structure to accommodate a portion of some other one of the first, second and third tile areas. Such an arrangement of tile areas further facilitates improved space efficiency, as compared to existing back end memory device architectures.

Figure 8:
FIG. 8 shows a circuit diagram illustrating features of a word line driver 800 to facilitate communication via a word line according to an embodiment.
Figure 8:
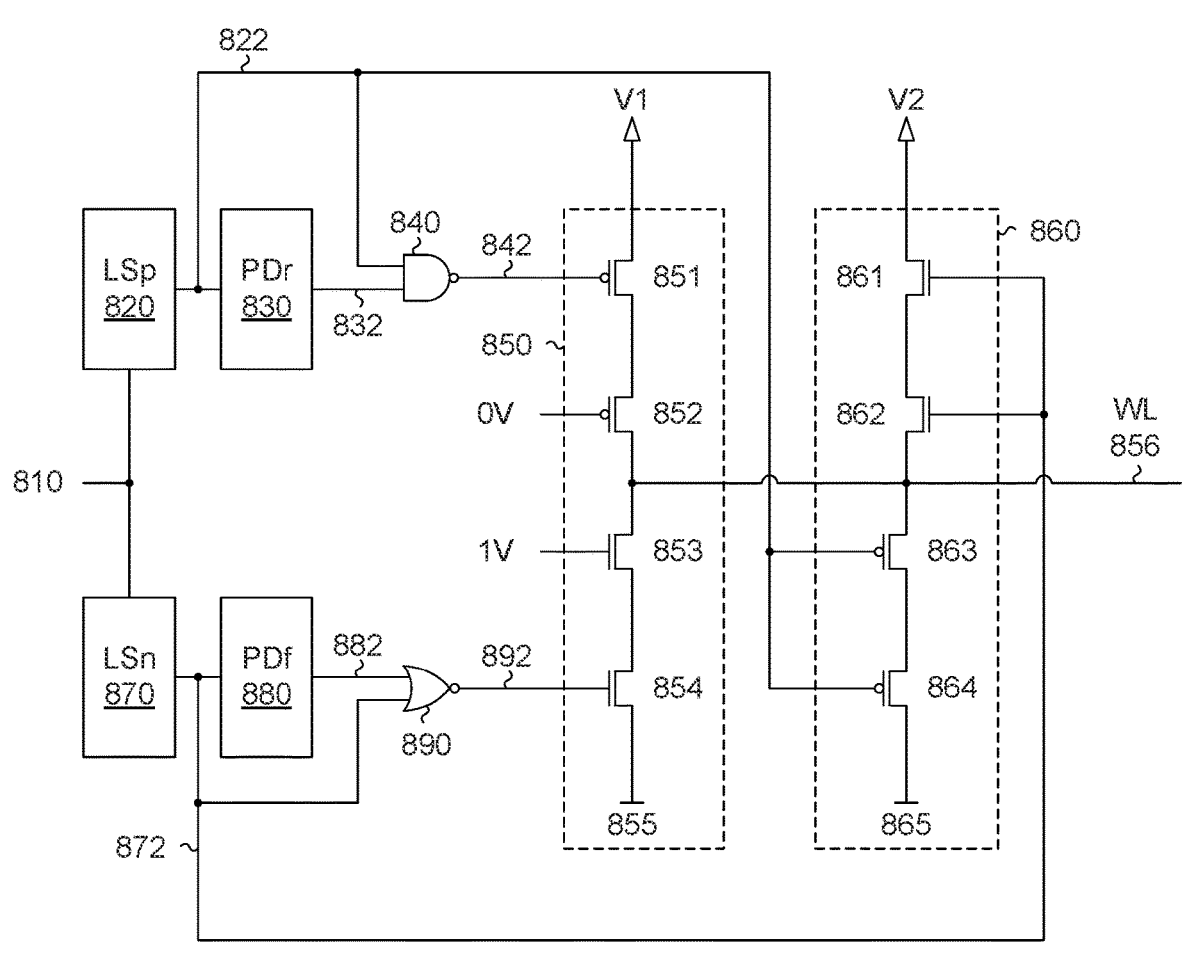

FIG. 8 shows features of a word line driver 800 to facilitate communication via a word line according to an embodiment. The word line driver 800 illustrates one example of an embodiment which includes a circuit (referred to herein as a "charge-discharge circuit") that is operable to increase or decrease a voltage at a word line, wherein a delay between two stages of the circuit mitigates hot carrier injection that would otherwise impact driver functionality in the long term. In various embodiments, word line driver 800 is implemented with IC structure 100, with one of IC devices 200, 300, 400, or with one of IC dies 500, 600, 700.

As shown in FIG. 8, word line driver 800 comprises a positive level shifter circuit (Lsp) 820, a delay circuit (PDr) 830 and a NAND gate 840 that—together—illustrate one example of first circuitry which, based on a word line select signal 810, is to selectively operate one type (e.g., p-type) of transistors of a charge-discharge circuit. Furthermore, word line driver 800 comprises a negative level shifter circuit (LSn) 870, a delay circuit (PDf) 880 and a NOR gate 890 that—together—illustrate an example of second circuitry which, based on the same word line select signal 810, is to selectively operate another type (e.g., n-type) of transistors of that charge-discharge circuit.

In various embodiments, the first circuitry generates a signal 822 based on select signal 810, and further generates another signal 842 with a first delay and signal 822. For example, positive level shifter circuit 820 applies a positive level shift to select signal 810 to generate signal 822. In one such embodiment, select signal 810 uses a first voltage level and a second voltage level (less than the first voltage level) which are each to indicate a different respective logic state. By contrast, signal 822 uses a third voltage level and a fourth voltage level—e.g., instead of (respectively) the first voltage level and the second logic level. For example, the third voltage level is greater than both the fourth voltage level and the first voltage level. In an embodiment, delay circuit PDr 830 generates a signal 832 based on an application of the first delay to signal 822—e.g., wherein NAND gate 840 generates signal 842 based on both of signals 822, 832.

Furthermore, the second circuitry generates a signal 872 based on select signal 810, and further generates another signal 842 with a second delay and signal 872. For example, negative level shifter circuit 870 applies a negative level shift to select signal 810 to generate signal 872. In one such embodiment, signal 872 uses a fifth voltage level and a sixth voltage level to represent respective logic states—e.g., instead of (respectively) the first voltage level and the second voltage level of select signal 810. For example, the sixth voltage level is less than both the fifth voltage level and the second voltage level. In an embodiment, delay circuit PDf 880 generates a signal 882 based on an application of the second delay to signal 872—e.g., wherein NOR gate 890 generates signal 892 based on both of signals 872, 882.

In the example embodiment shown, the charge-discharge circuit of word line driver 800 comprises a stage 860 which is coupled to receive signals 822, 872, and another stage 850 which is coupled to receive signals 842, 892. Stages 850, 860 are each coupled to a word line (WL) 856 that is to be driven with word line driver 800. For example, stage 860 is operable to variously increase and/or decrease a voltage at word line 856 based on signals 822, 872. Alternatively or in addition, stage 850 is operable to variously increase and/or decrease the voltage at word line 856 based on signals 842, 892.

By way of illustration and not limitation, stage 860 comprises n-type transistors 861, 862 which are coupled in series with each other between word line 856 and a node which is to provide a supply voltage V2. Stage 860 further comprises p-type transistors 863, 864 which are coupled in series with each other between word line 856 and another node which is to provide a reference potential 865 (e.g., a ground voltage) that, for example, is less than the supply voltage V2.

Additionally or alternatively, stage 850 comprises p-type transistors 851, 852 which are coupled in series with each other between word line 856 and a node which is to provide a supply voltage V1 (which, for example, is larger than supply voltage V2). Stage 850 further comprises n-type transistors 853, 854 which are coupled in series with each other between word line 856 and another node which is to provide a reference potential 855 that, for example, is less than the reference potential 865. In an illustrative scenario according to one embodiment, voltages V1, and V2 are 1.7V and 1.0 V, respectively—e.g., wherein reference potentials 855, 865 are –0.8 V and 0 V, respectively. However, some or all such voltages are different, alternatively, according to implementation-specific details which are not limiting on various embodiments.

The n-type transistors 861, 862 are coupled to operate responsive to signal 872, whereas p-type transistors 863, 864 are coupled to operate responsive to signal 822. Furthermore, p-type transistor 851 is coupled to operate responsive to signal 842, whereas n-type transistor 854 is coupled to operate responsive to signal 892. Based on the delay factors variously applied with delay circuit PDr 830 and delay circuit PDf 880, an increasing (or alternatively, a decreasing) of the voltage at word line WL 856 with stages 850, 860 takes place in a multi-stage sequence including two stages which correspond to different respective voltage change rates. In providing a relatively small voltage change rate, followed by a relatively large voltage change rate, some embodiments prevent or otherwise mitigate hot carrier injection that would otherwise impact the long-term operation of a word line driver such as word line driver 800.

Figure 9:
FIG. 9 shows a timing diagram illustrating operations performed with a word line driver according to an embodiment.
Figure 9:
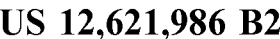

FIG. 9 shows a timing diagram 900 illustrating operations of word line driver 800 according to one illustrative embodiment. More particularly, timing diagram 900 shows respective characteristics of signals 810, 822, 832, 842, 872, 882, 892, and of word line 856, over a period of time 905 during operation of word line driver 800.

In an illustrative "word line fall" scenario according to one embodiment, p-type transistors 863, 864—during a period of time immediately leading up to the time t3 shown—are both off due to signal 822, and word line 856 is at a relatively high voltage, since p-type transistor 851 is on. At time t3, signal 810 begins a transition 910 to a relatively low voltage, which in turn contributes to respective transitions of signals 822, 872. Responsive to these respective transitions of signals 822, 872, stage 860 begins decreasing a voltage at word line 856 at a relatively slow rate during the period from time t3 to time t4 (and similarly, from time t9 to time t10). Subsequently, at time t4, signal 892 begins to undergo respective delayed transition 912 based on the transition of signal 810 at time t3. Responsive to delayed transitions 912, stage 850 begins decreasing the voltage at word line 856 at a relatively large rate, as compared to the rate during the period from time t3 to time t4.

In an illustrative "word line rise" scenario according to another embodiment, p-type transistors 863, 864—during a period of time immediately leading up to the time t6 shown—are both off due to signal 822, and word line 856 is at a relatively low voltage, since n-type transistor 854 is on. At time t6, signal 810 begins a transition 920 to a relatively high voltage, which in turn contributes to respective transitions of signals 822, 872. Responsive to these respective transitions of signals 822, 872, stage 860 begins increasing a voltage at word line 856 at a relatively slow rate during the period from time t6 to time t7 (and similarly, from time t0 to time t1). Subsequently, at time t7, signal 842 begins to undergo respective delayed transition 922 based on the transition of signal 810 at time t6. Responsive to delayed transitions 922, stage 850 begins increasing the voltage at word line 856 at a relatively large rate, as compared to the rate during the period from time t6 to time t7.

Figure 10:
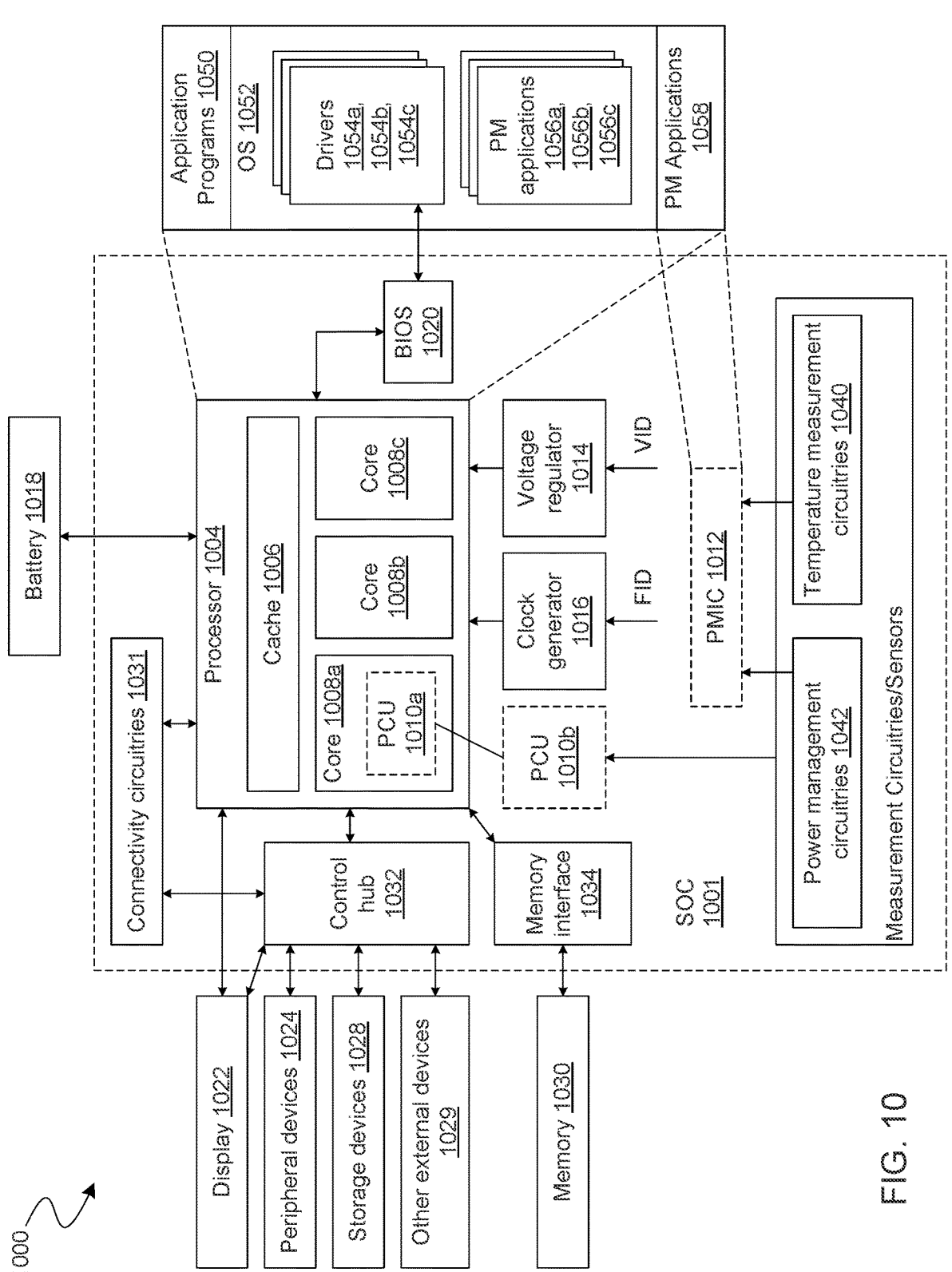
FIG. 10 shows a functional block diagram illustrating features of a computing device to provide access to back end memory arrays according to an embodiment.

FIG. 10 illustrates a computer system or computing device 1000 (also referred to as device 1000), wherein peripheral circuitry extends under, and is coupled to enable access to, multiple back end memory arrays, in accordance with some embodiments. It is pointed out that those elements of FIG. 10 having the same reference numbers (or names) as the elements of any other figure can operate or function in any manner similar to that described, but are not limited to such.

In some embodiments, device 1000 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 1000.

In an example, the device 1000 comprises a SoC (System-on-Chip) 1001. An example boundary of the SOC 1001 is illustrated using dotted lines in FIG. 10, with some example components being illustrated to be included within SOC 1001—however, SOC 1001 may include any appropriate components of device 1000.

In some embodiments, device 1000 includes processor 1004. Processor 1004 can include one or more physical devices, such as microprocessors, application processors, microcontrollers, programmable logic devices, processing cores, or other processing means. The processing operations performed by processor 1004 include the execution of an operating platform or operating system on which applications and/or device functions are executed. The processing operations include operations related to I/O (input/output) with a human user or with other devices, operations related to power management, operations related to connecting computing device 1000 to another device, and/or the like. The processing operations may also include operations related to audio I/O and/or display I/O.

In some embodiments, processor 1004 includes multiple processing cores (also referred to as cores) 1008a, 1008b, 1008c. Although merely three cores 1008a, 1008b, 1008c are illustrated in FIG. 10, the processor 1004 may include any other appropriate number of processing cores, e.g., tens, or even hundreds of processing cores. Processor cores 1008a, 1008b, 1008c may be implemented on a single integrated circuit (IC) chip. Moreover, the chip may include one or more shared and/or private caches, buses or interconnections, graphics and/or memory controllers, or other components.

In some embodiments, processor 1004 includes cache 1006. In an example, sections of cache 1006 may be dedicated to individual cores 1008 (e.g., a first section of cache 1006 dedicated to core 1008a, a second section of cache 1006 dedicated to core 1008b, and so on). In an example, one or more sections of cache 1006 may be shared among two or more of cores 1008. Cache 1006 may be split in different levels, e.g., level 1 (L1) cache, level 2 (L2) cache, level 3 (L3) cache, etc.

In some embodiments, a given processor core (e.g., core 1008a) may include a fetch unit to fetch instructions (including instructions with conditional branches) for execution by the core 1008a. The instructions may be fetched from any storage devices such as the memory 1030. Processor core 1008a may also include a decode unit to decode the fetched instruction. For example, the decode unit may decode the fetched instruction into a plurality of micro-operations. Processor core 1008a may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 1008a (for example) may be an out-of-order processor core in one embodiment. Processor core 1008a may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 1008a may also include a bus unit to enable communication between components of the processor core 1008a and other components via one or more buses. Processor core 1008a may also include one or more registers to store data accessed by various components of the core 1008a (such as values related to assigned app priorities and/or sub-system states (modes) association.

In some embodiments, device 1000 comprises connectivity circuitries 1031. For example, connectivity circuitries 1031 includes hardware devices (e.g., wireless and/or wired connectors and communication hardware) and/or software components (e.g., drivers, protocol stacks), e.g., to enable device 1000 to communicate with external devices. Device 1000 may be separate from the external devices, such as other computing devices, wireless access points or base stations, etc.

In an example, connectivity circuitries 1031 may include multiple different types of connectivity. To generalize, the connectivity circuitries 1031 may include cellular connectivity circuitries, wireless connectivity circuitries, etc. Cellular connectivity circuitries of connectivity circuitries 1031 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 1031 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 1031 may include a network interface, such as a wired or wireless interface, e.g., so that a system embodiment may be incorporated into a wireless device, for example, cell phone or personal digital assistant.

In some embodiments, device 1000 comprises control hub 1032, which represents hardware devices and/or software components related to interaction with one or more I/O devices. For example, processor 1004 may communicate with one or more of display 1022, one or more peripheral devices 1024, storage devices 1028, one or more other external devices 1029, etc., via control hub 1032. Control hub 1032 may be a chipset, a Platform Control Hub (PCH), and/or the like.

For example, control hub 1032 illustrates one or more connection points for additional devices that connect to device 1000, e.g., through which a user might interact with the system. For example, devices (e.g., devices 1029) that can be attached to device 1000 include microphone devices, speaker or stereo systems, audio devices, video systems or other display devices, keyboard or keypad devices, or other I/O devices for use with specific applications such as card readers or other devices.

As mentioned above, control hub 1032 can interact with audio devices, display 1022, etc. For example, input through a microphone or other audio device can provide input or commands for one or more applications or functions of device 1000. Additionally, audio output can be provided instead of, or in addition to display output. In another example, if display 1022 includes a touch screen, display 1022 also acts as an input device, which can be at least partially managed by control hub 1032. There can also be additional buttons or switches on computing device 1000 to provide I/O functions managed by control hub 1032. In one embodiment, control hub 1032 manages devices such as accelerometers, cameras, light sensors or other environmental sensors, or other hardware that can be included in device 1000. The input can be part of direct user interaction, as well as providing environmental input to the system to influence its operations (such as filtering for noise, adjusting displays for brightness detection, applying a flash for a camera, or other features).

In some embodiments, control hub 1032 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 1022 represents hardware (e.g., display devices) and software (e.g., drivers) components that provide a visual and/or tactile display for a user to interact with device 1000. Display 1022 may include a display interface, a display screen, and/or hardware device used to provide a display to a user. In some embodiments, display 1022 includes a touch screen (or touch pad) device that provides both output and input to a user. In an example, display 1022 may communicate directly with the processor 1004. Display 1022 can be one or more of an internal display device, as in a mobile electronic device or a laptop device or an external display device attached via a display interface (e.g., DisplayPort, etc.). In one embodiment display 1022 can be a head mounted display (HMD) such as a stereoscopic display device for use in virtual reality (VR) applications or augmented reality (AR) applications.

In some embodiments and although not illustrated in the figure, in addition to (or instead of) processor 1004, device 1000 may include Graphics Processing Unit (GPU) comprising one or more graphics processing cores, which may control one or more aspects of displaying contents on display 1022.

Control hub 1032 (or platform controller hub) may include hardware interfaces and connectors, as well as software components (e.g., drivers, protocol stacks) to make peripheral connections, e.g., to peripheral devices 1024.

It will be understood that device 1000 could both be a peripheral device to other computing devices, as well as have peripheral devices connected to it. Device 1000 may have a "docking" connector to connect to other computing devices for purposes such as managing (e.g., downloading and/or uploading, changing, synchronizing) content on device 1000. Additionally, a docking connector can allow device 1000 to connect to certain peripherals that allow computing device 1000 to control content output, for example, to audiovisual or other systems.

In addition to a proprietary docking connector or other proprietary connection hardware, device 1000 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 1031 may be coupled to control hub 1032, e.g., in addition to, or instead of, being coupled directly to the processor 1004. In some embodiments, display 1022 may be coupled to control hub 1032, e.g., in addition to, or instead of, being coupled directly to processor 1004.

In some embodiments, device 1000 comprises memory 1030 coupled to processor 1004 via memory interface 1034. Memory 1030 includes memory devices for storing information in device 1000. Memory can include nonvolatile (state does not change if power to the memory device is interrupted) and/or volatile (state is indeterminate if power to the memory device is interrupted) memory devices. Memory device 1030 can be a dynamic random access memory (DRAM) device, a static random access memory (SRAM) device, flash memory device, phase-change memory device, or some other memory device having suitable performance to serve as process memory. In one embodiment, memory 1030 can operate as system memory for device 1000, to store data and instructions for use when the one or more processors 1004 executes an application or process. Memory 1030 can store application data, user data, music, photos, documents, or other data, as well as system data (whether long-term or temporary) related to the execution of the applications and functions of device 1000.

Elements of various embodiments and examples are also provided as a machine-readable medium (e.g., memory 1030) for storing the computer-executable instructions (e.g., instructions to implement any other processes discussed herein). The machine-readable medium (e.g., memory 1030) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 1000 comprises temperature measurement circuitries 1040, e.g., for measuring temperature of various components of device 1000. In an example, temperature measurement circuitries 1040 may be embedded, or coupled or attached to various components, whose temperature are to be measured and monitored. For example, temperature measurement circuitries 1040 may measure temperature of (or within) one or more of cores 1008$a$, 1008$b$, 1008$c$, voltage regulator 1014, memory 1030, a mother-board of SOC 1001, and/or any appropriate component of device 1000.

In some embodiments, device 1000 comprises power measurement circuitries 1042, e.g., for measuring power consumed by one or more components of the device 1000. In an example, in addition to, or instead of, measuring power, the power measurement circuitries 1042 may measure voltage and/or current. In an example, the power measurement circuitries 1042 may be embedded, or coupled or attached to various components, whose power, voltage, and/or current consumption are to be measured and monitored. For example, power measurement circuitries 1042 may measure power, current and/or voltage supplied by one or more voltage regulators 1014, power supplied to SOC 1001, power supplied to device 1000, power consumed by processor 1004 (or any other component) of device 1000, etc.

In some embodiments, device 1000 comprises one or more voltage regulator circuitries, generally referred to as voltage regulator (VR) 1014. VR 1014 generates signals at appropriate voltage levels, which may be supplied to operate any appropriate components of the device 1000. Merely as an example, VR 1014 is illustrated to be supplying signals to processor 1004 of device 1000. In some embodiments, VR 1014 receives one or more Voltage Identification (VID) signals, and generates the voltage signal at an appropriate level, based on the VID signals. Various type of VRs may be utilized for the VR 1014. For example, VR 1014 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 1010*a/b* and/or PMIC 1012. In some embodiments, each core has a network of distributed LDOs to provide efficient control for power management. The LDOs can be digital, analog, or a combination of digital or analog LDOs.

In some embodiments, device 1000 comprises one or more clock generator circuitries, generally referred to as clock generator 1016. Clock generator 1016 generates clock signals at appropriate frequency levels, which may be supplied to any appropriate components of device 1000. Merely as an example, clock generator 1016 is illustrated to be supplying clock signals to processor 1004 of device 1000. In some embodiments, clock generator 1016 receives one or more Frequency Identification (FID) signals, and generates the clock signals at an appropriate frequency, based on the FID signals.

In some embodiments, device 1000 comprises battery 1018 supplying power to various components of device 1000. Merely as an example, battery 1018 is illustrated to be supplying power to processor 1004. Although not illustrated in the figures, device 1000 may comprise a charging circuitry, e.g., to recharge the battery, based on Alternating Current (AC) power supply received from an AC adapter.

In some embodiments, device 1000 comprises Power Control Unit (PCU) 1010 (also referred to as Power Management Unit (PMU), Power Controller, etc.). In an example, some sections of PCU 1010 may be implemented by one or more processing cores 1008, and these sections of PCU 1010 are symbolically illustrated using a dotted box and labelled PCU 1010*a*. In an example, some other sections of PCU 1010 may be implemented outside the processing cores 1008, and these sections of PCU 1010 are symbolically illustrated using a dotted box and labelled as PCU 1010*b*. PCU 1010 may implement various power management operations for device 1000. PCU 1010 may include hardware interfaces, hardware circuitries, connectors, registers, etc., as well as software components (e.g., drivers, protocol stacks), to implement various power management operations for device 1000.

In some embodiments, device 1000 comprises Power Management Integrated Circuit (PMIC) 1012, e.g., to implement various power management operations for device 1000. In some embodiments, PMIC 1012 is a Reconfigurable Power Management ICs (RPMICs) and/or an IMVP (Intel® Mobile Voltage Positioning). In an example, the PMIC is within an IC chip separate from processor 1004. The may implement various power management operations for device 1000. PMIC 1012 may include hardware interfaces, hardware circuitries, connectors, registers, etc., as well as software components (e.g., drivers, protocol stacks), to implement various power management operations for device 1000.

In an example, device 1000 comprises one or both PCU 1010 or PMIC 1012. In an example, any one of PCU 1010 or PMIC 1012 may be absent in device 1000, and hence, these components are illustrated using dotted lines.

Various power management operations of device 1000 may be performed by PCU 1010, by PMIC 1012, or by a combination of PCU 1010 and PMIC 1012. For example, PCU 1010 and/or PMIC 1012 may select a power state (e.g., P-state) for various components of device 1000. For example, PCU 1010 and/or PMIC 1012 may select a power state (e.g., in accordance with the ACPI (Advanced Configuration and Power Interface) specification) for various components of device 1000. Merely as an example, PCU 1010 and/or PMIC 1012 may cause various components of the device 1000 to transition to a sleep state, to an active state, to an appropriate C state (e.g., CO state, or another appropriate C state, in accordance with the ACPI specification), etc. In an example, PCU 1010 and/or PMIC 1012 may control a voltage output by VR 1014 and/or a frequency of a clock signal output by the clock generator, e.g., by outputting the VID signal and/or the FID signal, respectively. In an example, PCU 1010 and/or PMIC 1012 may control battery power usage, charging of battery 1018, and features related to power saving operation.

The clock generator 1016 can comprise a phase locked loop (PLL), frequency locked loop (FLL), or any suitable clock source. In some embodiments, each core of processor 1004 has its own clock source. As such, each core can operate at a frequency independent of the frequency of operation of the other core. In some embodiments, PCU 1010 and/or PMIC 1012 performs adaptive or dynamic frequency scaling or adjustment. For example, clock frequency of a processor core can be increased if the core is not operating at its maximum power consumption threshold or limit. In some embodiments, PCU 1010 and/or PMIC 1012 determines the operating condition of each core of a processor, and opportunistically adjusts frequency and/or power supply voltage of that core without the core clocking source (e.g., PLL of that core) losing lock when the PCU 1010 and/or PMIC 1012 determines that the core is operating below a target performance level. For example, if a core is drawing current from a power supply rail less than a total current allocated for that core or processor 1004, then PCU 1010 and/or PMIC 1012 can temporarily increase the power draw for that core or processor 1004 (e.g., by increasing clock frequency and/or power supply voltage level) so that the core or processor 1004 can perform at a higher performance level. As such, voltage and/or frequency can be increased temporality for processor 1004 without violating product reliability.

In an example, PCU 1010 and/or PMIC 1012 may perform power management operations, e.g., based at least in part on receiving measurements from power measurement circuitries 1042, temperature measurement circuitries 1040, charge level of battery 1018, and/or any other appropriate information that may be used for power management. To that end, PMIC 1012 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 1010 and/or PMIC 1012 in at least one embodiment to allow PCU 1010 and/or PMIC 1012 to manage processor core energy at least in part based on value(s) detected by one or more of the sensors.

Also illustrated is an example software stack of device 1000 (although not all elements of the software stack are illustrated). Merely as an example, processors 1004 may execute application programs 1050, Operating System 1052, one or more Power Management (PM) specific application programs (e.g., generically referred to as PM applications 1058), and/or the like. PM applications 1058 may also be executed by the PCU 1010 and/or PMIC 1012. OS 1052 may also include one or more PM applications 1056*a*, 1056*b*, 1056*c*. The OS 1052 may also include various drivers 1054*a*, 1054*b*, 1054*c*, etc., some of which may be specific for power management purposes. In some embodiments, device 1000 may further comprise a Basic Input/Output System (BIOS) 1020. BIOS 1020 may communicate with OS 1052 (e.g., via one or more drivers 1054), communicate with processors 1004, etc.

For example, one or more of PM applications 1058, 1056, drivers 1054, BIOS 1020, etc. may be used to implement power management specific tasks, e.g., to control voltage and/or frequency of various components of device 1000, to control wake-up state, sleep state, and/or any other appropriate power state of various components of device 1000, control battery power usage, charging of the battery 1018, features related to power saving operation, etc.

In various embodiments, one or more memory resources of device 1000—e.g., including some or all memory resources of cache 1006 and/or memory 1030—are provided with circuitry such as that of IC structure 100, IC device 200, IC device 300, or IC device 400. Additionally or alternatively, one or more memory resources of device 1000 are operated with peripheral circuitry which, for example, provides functionality of word line driver 800.

In one or more first embodiments, an integrated circuit (IC) die comprises a first memory array comprising first dynamic random access memory (DRAM) cells, a second memory array comprising second DRAM cells, wherein a back end of line (BEOL) of the IC die comprises a first array level, and wherein the first memory array and the second memory array are each in the first array level, and a differential sense amplifier coupled to the first memory array and the second memory array via a first bit line and a second bit line, respectively, wherein the differential sense amplifier is to receive a first signal and a second signal via the first bit line and the second bit line, respectively, and generate, based on each of the first signal and the second signal, an output which indicates a bit value at one of the first DRAM cells or one of the second DRAM cells, wherein the first bit line and the second bit line extend from the first array level, toward a front end of line (FEOL) of the IC die, on opposite respective sides of first memory array, and wherein, at the FEOL, the differential sense amplifier is in a first footprint region corresponding to the first memory array.

In one or more second embodiments, further to the first embodiment, the IC die further comprises a third memory array comprising third DRAM cells, wherein the BEOL of the IC die comprises a second array level, and wherein the third memory array is in the second array level, and first level selection circuitry coupled between the differential sense amplifier and each of the first bit line and a third bit line, wherein the first level selection circuitry is coupled to the third memory array via the third bit line, and wherein the first level selection circuitry is to selectively couple the differential sense amplifier to either of the first array level or the second array level.

In one or more third embodiments, further to the second embodiment, the first level selection circuitry is in the first footprint region.

In one or more fourth embodiments, further to the second embodiment, the IC die further comprises a fourth memory array comprising fourth DRAM cells, wherein the fourth memory array is in the second array level, and second level selection circuitry coupled between the differential sense amplifier and each of the first bit line and a fourth bit line, wherein the second level selection circuitry is coupled to the fourth memory array via the fourth bit line, and wherein the second level selection circuitry is to selectively couple the differential sense amplifier to either of the first array level or the second array level.

In one or more fifth embodiments, further to the fourth embodiment, the first level selection circuitry and the second level selection circuitry are each in the first footprint region.

In one or more sixth embodiments, further to the second embodiment, the IC die further comprises a first word line driver circuit coupled to the second memory array via a first word line, and a second word line driver circuit coupled to the fourth memory array via a second word line, wherein the first word line driver circuit and the second word line driver circuit are each in a second footprint region corresponding to the second memory array.

In one or more seventh embodiments, further to the sixth embodiment, in the second footprint region, a portion of the first word line extends vertically from the first array level toward the FEOL, and wherein a portion of the second word line extends vertically past the first array level, and toward the FEOL, in a region which is outside of a periphery of the second memory array.

In one or more eighth embodiments, further to the sixth embodiment, first peripheral circuitry of the IC die is to access the first memory array, the second memory array, the third memory array and the fourth memory array, wherein the first peripheral circuitry is arranged in a first tile area of the FEOL, and wherein the tile area forms recess structures each at a respective one of opposite ends of the first tile area.

In one or more ninth embodiments, further to the eighth embodiment, the first peripheral circuitry comprises the differential sense amplifier, the first level selection circuitry, the second level selection circuitry, the first word line driver circuit, the second word line driver circuit, and a third word line driver circuit coupled to a fifth memory array via a third word line, wherein a third array level of the BEOL comprises the fifth memory array.

In one or more tenth embodiments, a system comprises an integrated circuit (IC) die comprising a first memory array comprising first dynamic random access memory (DRAM) cells, a second memory array comprising second DRAM cells, wherein a back end of line (BEOL) of the IC die comprises a first array level, and wherein the first memory array and the second memory array are each in the first array level, and a differential sense amplifier coupled to the first memory array and the second memory array via a first bit line and a second bit line, respectively, wherein the differential sense amplifier is to receive a first signal and a second signal via the first bit line and the second bit line, respectively, and generate, based on each of the first signal and the second signal, an output which indicates a bit value at one of the first DRAM cells or one of the second DRAM cells, wherein the first bit line and the second bit line extend from the first array level, toward a front end of line (FEOL) of the IC die, on opposite respective sides of first memory array, and wherein, at the FEOL, the differential sense amplifier is in a first footprint region corresponding to the first memory array, and a display device coupled to the IC die, the display device to display an image based on the bit value.

In one or more eleventh embodiments, further to the tenth embodiment, the IC die further comprises a third memory array comprising third DRAM cells, wherein the BEOL of the IC die comprises a second array level, and wherein the third memory array is in the second array level, and first level selection circuitry coupled between the differential sense amplifier and each of the first bit line and a third bit line, wherein the first level selection circuitry is coupled to the third memory array via the third bit line, and wherein the first level selection circuitry is to selectively couple the differential sense amplifier to either of the first array level or the second array level.

In one or more twelfth embodiments, further to the eleventh embodiment, the first level selection circuitry is in the first footprint region.

In one or more thirteenth embodiments, further to the eleventh embodiment, the IC die further comprises a fourth memory array comprising fourth DRAM cells, wherein the fourth memory array is in the second array level, and second level selection circuitry coupled between the differential sense amplifier and each of the first bit line and a fourth bit line, wherein the second level selection circuitry is coupled to the fourth memory array via the fourth bit line, and wherein the second level selection circuitry is to selectively couple the differential sense amplifier to either of the first array level or the second array level.

In one or more fourteenth embodiments, further to the thirteenth embodiment, the first level selection circuitry and the second level selection circuitry are each in the first footprint region.

In one or more fifteenth embodiments, further to the eleventh embodiment, the IC die further comprises a first word line driver circuit coupled to the second memory array via a first word line, and a second word line driver circuit coupled to the fourth memory array via a second word line, wherein the first word line driver circuit and the second word line driver circuit are each in a second footprint region corresponding to the second memory array.

In one or more sixteenth embodiments, further to the fifteenth embodiment, in the second footprint region, a portion of the first word line extends vertically from the first array level toward the FEOL, and wherein a portion of the second word line extends vertically past the first array level, and toward the FEOL, in a region which is outside of a periphery of the second memory array.

In one or more seventeenth embodiments, further to the fifteenth embodiment, first peripheral circuitry of the IC die is to access the first memory array, the second memory array, the third memory array and the fourth memory array, wherein the first peripheral circuitry is arranged in a first tile area of the FEOL, and wherein the tile area forms recess structures each at a respective one of opposite ends of the first tile area.

In one or more eighteenth embodiments, further to the seventeenth embodiment, the first peripheral circuitry comprises the differential sense amplifier, the first level selection circuitry, the second level selection circuitry, the first word line driver circuit, the second word line driver circuit, and a third word line driver circuit coupled to a fifth memory array via a third word line, wherein a third array level of the BEOL comprises the fifth memory array.

In one or more nineteenth embodiments, a driver circuit comprises first circuitry to receive a word line select signal, the first circuitry to generate a first signal based on the word line select signal, and further to generate a second signal with a first delay and the first signal, second circuitry to receive the word line select signal, the second circuitry to generate a third signal based on the word line select signal, and further to generate a fourth signal with a second delay and the third signal, and a charge-discharge circuit coupled to each of the first circuitry, the second circuitry, and a word line, the charge-discharge circuit comprising a first stage to decrease or increase a voltage at the word line based on the first signal and the third signal, a second stage to decrease or increase the voltage at the word line based on the second signal and the fourth signal.

In one or more twentieth embodiments, further to the nineteenth embodiment, the first circuitry comprises an upper level shifter circuit to generate the first signal based on the word line select signal.

In one or more twenty-first embodiments, further to the twentieth embodiment, the second circuitry comprises a lower level shifter circuit to generate the third signal based on the word line select signal.

In one or more twenty-second embodiments, further to the nineteenth embodiment or the twentieth embodiment, the first circuitry comprises a first delay circuit to generate a fifth signal based on an application of the first delay to the first signal, and a NAND gate circuit to receive both the first signal and the fifth signal, and to output the second signal.

In one or more twenty-third embodiments, further to the twenty-second embodiment, the second circuitry comprises a second delay circuit to generate a sixth signal based on an application of the second delay to the third signal, and a NOR gate circuit to receive both the third signal and the sixth signal, and to output the fourth signal.

In one or more twenty-fourth embodiments, further to the nineteenth embodiment or the twentieth embodiment, the first stage comprises first transistors coupled in series with each other between the word line and a first node to provide a first voltage, and second transistors coupled in series with each other between the word line and a second node to provide a second voltage which is less than the first voltage, and wherein the second stage comprises third transistors coupled in series with each other between the word line and a third node to provide a third voltage, fourth transistors coupled in series with each other between the word line and a fourth node to provide a fourth voltage which is less than the third voltage.

In one or more twenty-fifth embodiments, further to the twenty-fourth embodiment, the first voltage is less than the third voltage, and wherein the second voltage is greater than the fourth voltage.

Techniques and architectures for providing access to memory resources are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) die comprising:
a first memory array comprising first dynamic random access memory (DRAM) cells, wherein the first memory array extends in a first area of a first horizontal plane, wherein the first area comprises a maximum horizontal range of any memory cells of the first memory array which are in the first horizontal plane, and wherein a first edge of the first area is opposite a second edge of the first area;
a second memory array comprising second DRAM cells, wherein the second memory array extends in a second area of the first horizontal plane, wherein the second area comprises a maximum horizontal range of any memory cells of the second memory array which are in the first horizontal plane, wherein a back end of line (BEOL) of the IC die comprises a first array level, and wherein the first memory array and the second memory array are each in the first array level; and
a differential sense amplifier coupled to the first memory array and the second memory array via a first bit line and a second bit line, respectively, wherein the differential sense amplifier is to:
receive a first signal and a second signal via the first bit line and the second bit line, respectively;
generate, based on each of the first signal and the second signal, an output which indicates a bit value at one of the first DRAM cells or one of the second DRAM cells;
wherein:
the first bit line and the second bit line extend from the first array level toward a front end of line (FEOL) of the IC die;
a portion of the first bit line extends vertically through the first horizontal plane at a first location which is external to the first area;
the second edge is between the first location and each of the first edge and the second area;
a portion of the second bit line extends vertically through the first horizontal plane at a second location which is between the first edge and the second area; and
a maximum horizontal range of the differential sense amplifier in a second horizontal plane of the FEOL is within a third area of the second horizontal plane, wherein the third area is within a footprint of the first area.

2. The IC die of claim 1, further comprising:
a third memory array comprising third DRAM cells, wherein the BEOL of the IC die comprises a second array level, and wherein the third memory array is in the second array level; and
first level selection circuitry coupled between the differential sense amplifier and each of the first bit line and a third bit line, wherein the first level selection circuitry is coupled to the third memory array via the third bit line, and wherein the first level selection circuitry is to selectively couple the differential sense amplifier to either of the first array level or the second array level.

3. The IC die of claim 2, wherein the first level selection circuitry is in the footprint of the first area.

4. The IC die of claim 2, further comprising:
a fourth memory array comprising fourth DRAM cells, wherein the fourth memory array is in the second array level; and
second level selection circuitry coupled between the differential sense amplifier and each of the first bit line and a fourth bit line, wherein the second level selection circuitry is coupled to the fourth memory array via the fourth bit line, and wherein the second level selection circuitry is to selectively couple the differential sense amplifier to either of the first array level or the second array level.

5. The IC die of claim 4, wherein the first level selection circuitry and the second level selection circuitry are each in the footprint of the first area.

6. The IC die of claim 4, further comprising:
a first word line driver circuit coupled to the second memory array via a first word line; and
a second word line driver circuit coupled to the fourth memory array via a second word line;

wherein the first word line driver circuit and the second word line driver circuit are each in a second footprint region corresponding to the second memory array.

7. The IC die of claim 6, wherein, in the second footprint region, a portion of the first word line extends vertically from the first array level toward the FEOL; and wherein a portion of the second word line extends vertically past the first array level, and toward the FEOL, in a region which is outside of a periphery of the second memory array.

8. The IC die of claim 6, wherein first peripheral circuitry of the IC die is to access the first memory array, the second memory array, the third memory array and the fourth memory array;

wherein the first peripheral circuitry is arranged in a first tile area of the FEOL; and wherein the first tile area forms recess structures each at a respective one of opposite ends of the first tile area.

9. The IC die of claim 8, wherein the first peripheral circuitry comprises:

the differential sense amplifier;

the first level selection circuitry;

the second level selection circuitry;

the first word line driver circuit;

the second word line driver circuit; and a third word line driver circuit coupled to a fifth memory array via a third word line, wherein a third array level of the BEOL comprises the fifth memory array.

10. A system comprising:

an integrated circuit (IC) die comprising:

a first memory array comprising first dynamic random access memory (DRAM) cells, wherein the first memory array extends in a first area of a first horizontal plane, wherein the first area comprises a maximum horizontal range of any memory cells of the first memory array which are in the first horizontal plane, and wherein a first edge of the first area is opposite a second edge of the first area;

a second memory array comprising second DRAM cells, wherein the second memory array extends in a second area of the first horizontal plane, wherein the second area comprises a maximum horizontal range of any memory cells of the second memory array which are in the first horizontal plane, wherein a back end of line (BEOL) of the IC die comprises a first array level, and wherein the first memory array and the second memory array are each in the first array level; and a differential sense amplifier coupled to the first memory array and the second memory array via a first bit line and a second bit line, respectively, wherein the differential sense amplifier is to:

receive a first signal via the first bit line, and receive a second signal via the second bit line; and generate, based on each of the first signal and the second signal, an output which indicates a bit value at one of the first DRAM cells or one of the second DRAM cells;

wherein:

the first bit line and the second bit line extend from the first array level toward a front end of line (FEOL) of the IC die;

a portion of the first bit line extends vertically through the first horizontal plane at a first location which is external to the first area;

the second edge is between the first location and each of the first edge and the second area;

a portion of the second bit line extends vertically through the first horizontal plane at a second location which is between the first edge and the second area; and a maximum horizontal range of the differential sense amplifier in a second horizontal plane of the FEOL, is within a third area of the second horizontal plane, wherein the third area is within a footprint of the first area; and a display device coupled to the IC die, the display device to display an image based on the bit value.

11. The system of claim 10, further comprising:

a third memory array comprising third DRAM cells, wherein the BEOL of the IC die comprises a second array level, and wherein the third memory array is in the second array level; and first level selection circuitry coupled between the differential sense amplifier and each of the first bit line and a third bit line, wherein the first level selection circuitry is coupled to the third memory array via the third bit line, and wherein the first level selection circuitry is to selectively couple the differential sense amplifier to either of the first array level or the second array level.

12. The system of claim 11, further comprising:

a fourth memory array;

a first word line driver circuit coupled to the second memory array via a first word line; and a second word line driver circuit coupled to the fourth memory array via a second word line;

wherein the first word line driver circuit and the second word line driver circuit are each in a second footprint region corresponding to the second memory array.

13. The system of claim 12, wherein, in the second footprint region, a portion of the first word line extends vertically from the first array level toward the FEOL; and wherein a portion of the second word line extends vertically past the first array level, and toward the FEOL, in a region which is outside of a periphery of the second memory array.

* * * * *